(12) United States Patent
Hikida

(10) Patent No.: US 8,598,669 B2
(45) Date of Patent: Dec. 3, 2013

(54) SEMICONDUCTOR DEVICE, AND ITS MANUFACTURING METHOD

(75) Inventor: Satoshi Hikida, Osaka (JP)

(73) Assignee: Sharp Kabushiki Kaisha, Osaka-Shi, Osaka (JP)

( * ) Notice: Subject to any disclaimer, the term of this patent is extended or adjusted under 35 U.S.C. 154(b) by 0 days.

(21) Appl. No.: 13/496,436

(22) PCT Filed: Sep. 15, 2010

(86) PCT No.: PCT/JP2010/065967
§ 371 (c)(1),
(2), (4) Date: Mar. 15, 2012

(87) PCT Pub. No.: WO2011/034101
PCT Pub. Date: Mar. 24, 2011

(65) Prior Publication Data
US 2012/0168869 A1    Jul. 5, 2012

(30) Foreign Application Priority Data
Sep. 16, 2009  (JP) .................................. 2009-215037

(51) Int. Cl.
*H01L 29/66* (2006.01)
(52) U.S. Cl.
USPC ...................... 257/365; 257/344; 257/E21.37
(58) Field of Classification Search
USPC ....... 257/E21.177, E21.35, E21.369, E21.37, 257/E21.4, E21.457
See application file for complete search history.

(56) References Cited

U.S. PATENT DOCUMENTS

| 2006/0065928 | A1 | 3/2006 | Nagai |
| 2009/0221124 | A1 | 9/2009 | Yamauchi |

FOREIGN PATENT DOCUMENTS

| JP | 08-7012 A | 3/1996 |
| JP | 2004-047721 A | 2/2004 |
| JP | 2006-100404 A | 4/2006 |
| JP | 2008-166607 A | 7/2008 |
| JP | 2009-206412 A | 9/2009 |

*Primary Examiner* — Cheung Lee
(74) *Attorney, Agent, or Firm* — Birch, Stewart, Kolasch & Birch, LLP

(57) ABSTRACT

The present invention provides a high breakdown voltage transistor that eases an electric field concentration caused between a gate and a drain. The present invention provides a semiconductor device comprising: a first gate electrode formed above a semiconductor substrate through a gate insulating film; a second gate electrode that is formed above the semiconductor substrate through the gate insulating film, and that is arranged at the side of the first gate electrode through an insulating spacer; a source region and a drain region formed on the semiconductor substrate so as to sandwich the first and second gate electrodes; and an electric-field concentration easing region that is formed to sandwich some region of the semiconductor substrate below the first gate electrode, and that is formed to be overlapped with the second gate electrode and the source and drain regions.

8 Claims, 19 Drawing Sheets

SEMICONDUCTOR DEVICE, AND ITS MANUFACTURING METHOD

TECHNICAL FIELD

The present invention relates to a semiconductor device, and its manufacturing method, and more particularly to a high breakdown voltage transistor.

BACKGROUND ART

Microfabrication in a manufacturing process of a transistor has been progressed, resulting in that a transistor has been more and more downsized in recent years. With this, an avoidance of an electric field concentration caused at an end of a drain region has been desired. Microfabrication even in a manufacturing process of a high voltage resistance transistor (e.g., a MOS transistor used in a liquid crystal display driver circuit) requiring a voltage resistance characteristic has been progressed, whereby a size of a transistor has been reduced. On the other hand, an improvement of an electric field concentration caused between a gate and a drain has been desired. In particular, an improvement in a GIDL (Gate Induced Drain Leakage) due to the electric field concentration has been desired.

As a technique of improving the electric field concentration, there have been known a technique (offset LOCOS) of forming a gate oxide film below an end of a gate electrode to be thicker than a channel region, and a technique that is a modification of this technique, wherein an offset region is formed between a drain high-concentration region as well as a silicide region, and a gate electrode (see, for example, Patent Document 1).

The technique of forming the offset region between the drain high-concentration region as well as the silicide region, and the gate electrode will be described with reference to FIG. 19.

FIG. 19 is a sectional view illustrating a semiconductor device according to a conventional art. In the semiconductor device according to the conventional art, a drain region of a MOS field-effect transistor includes a low-concentration diffusion layer 70 of a second conductive type formed on a surface of a semiconductor substrate 1 of a first conductive type; a high-concentration diffusion layer 130 of a second conductive type that is enclosed by the low-concentration diffusion layer 70, and that is formed inward from an outer perimeter of the low-concentration diffusion layer 70 by a predetermined distance; and a silicide layer 120 that is enclosed by the high-concentration diffusion layer 130, and that is formed inward from an outer perimeter of the high-concentration diffusion layer 130 by a predetermined distance. The silicide layer is arranged adjacent to an offset-forming insulating layer 300 formed over a top of a certain region of the high-concentration diffusion layer 130 from a top of a certain region on a gate electrode 90, whereby the silicide layer 120 is formed apart from the gate electrode 90 by a predetermined distance. Specifically, the silicide layer 120 is formed with an offset region (the region B in FIG. 19) being present between other regions on the gate electrode 90 and the silicide layer 120.

RELATED ART DOCUMENT

Patent Document

Patent Document 1: Japanese Unexamined Patent Publication No. 2004-47721

SUMMARY OF THE INVENTION

Problem to be Solved by the Invention

However, this conventional technique needs to form and pattern the offset-forming insulating layer. Since a new layer is patterned on a top layer, the size of the transistor has to be increased in consideration of a processing accuracy in a photolithography process (e.g., processing accuracy for "A" and "C" in FIG. 19. "A" indicates a distance between an edge of the silicide layer 120 on the gate electrode 90 and an end of the gate electrode 90, and indicates an overlap width of the offset-forming insulating layer 300 and the gate electrode 90. "C" indicates a distance between an end of an isolation region 20 and the end of the silicide layer 120 on the drain region). When the offset-forming insulating layer formed on the top layer is overlapped with the gate electrode, it becomes difficult to uniformly dope an impurity into the gate electrode. Therefore, the transistor has to be designed in consideration of a variation in the characteristic of the transistor (e.g., electrical variation of the gate electrode).

The present invention is accomplished in view of the foregoing circumstance, and aims to provide a high breakdown voltage transistor that eases an electric field concentration caused between a gate and a drain, and that can be manufactured by a more simple process.

Means for Solving the Problems

The present invention provides a semiconductor device, and its manufacturing method. The semiconductor device comprises a first gate electrode formed above a semiconductor substrate through a gate insulating film; a second gate electrode that is formed above the semiconductor substrate through the gate insulating film, and that is arranged at the side of the first gate electrode through an insulating spacer; a source region and a drain region formed on the semiconductor substrate so as to sandwich the first and second gate electrodes; and an electric-field concentration easing region that is formed to sandwich some region of the semiconductor substrate below the first gate electrode, and that is formed to be overlapped with the second gate electrode and the source and drain regions.

Effects of the Invention

The semiconductor device comprises a first gate electrode formed above a semiconductor substrate through a gate insulating film; a second gate electrode that is formed above the semiconductor substrate through the gate insulating film, and that is arranged at the side of the first gate electrode through an insulating spacer; a source region and a drain region formed on the semiconductor substrate so as to sandwich the first and second gate electrodes; and an electric-field concentration easing region that is formed to sandwich some region of the semiconductor substrate below the first gate electrode, and that is formed to be overlapped with the second gate electrode and the source and drain regions. Therefore, the distance between the first gate electrode and the source and drain regions can be increased, and an electric field can be applied through the electric-field concentration easing region. Accordingly, the electric field concentration caused between the gate and the drain can be eased.

The region for increasing the distance between the first gate electrode and the gate and drain regions can be formed during a process of forming the gate electrode. Therefore, it is unnecessary to pattern a new layer on the top layer. Accordingly, the present invention can provide a semiconductor device that can be manufactured by a more simple process.

Since it is unnecessary to pattern a new layer on the top layer, the semiconductor device is less susceptible to the processing accuracy during the photolithography process. Accordingly, the present invention can provide a more compact semiconductor device.

MODE FOR CARRYING OUT THE INVENTION

Figure 1:
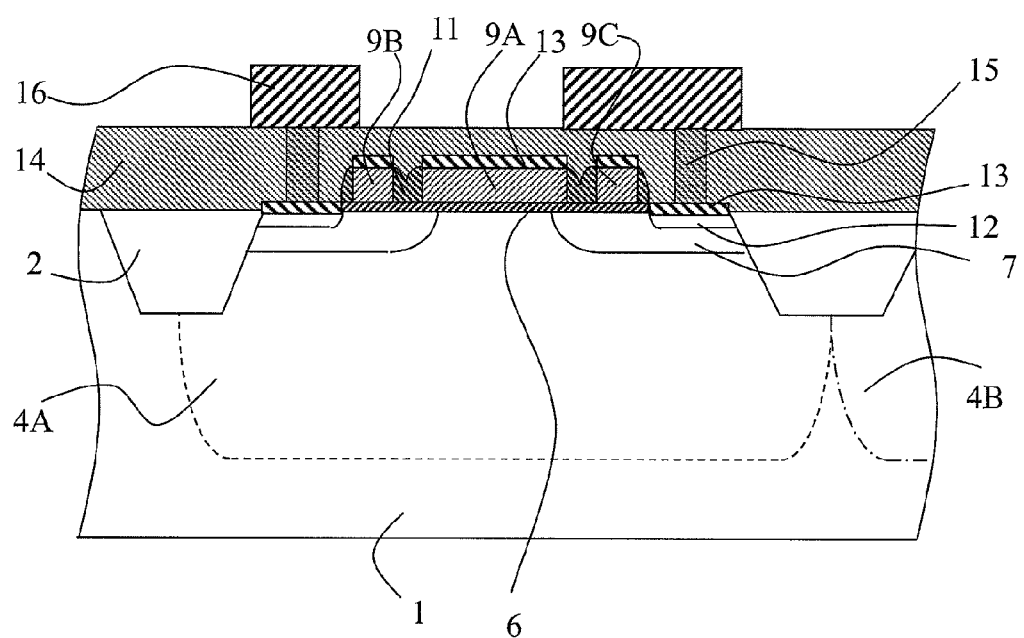
FIG. 1 is a sectional view conceptually illustrating a semiconductor device according to one embodiment of the present invention.
Figure 2:
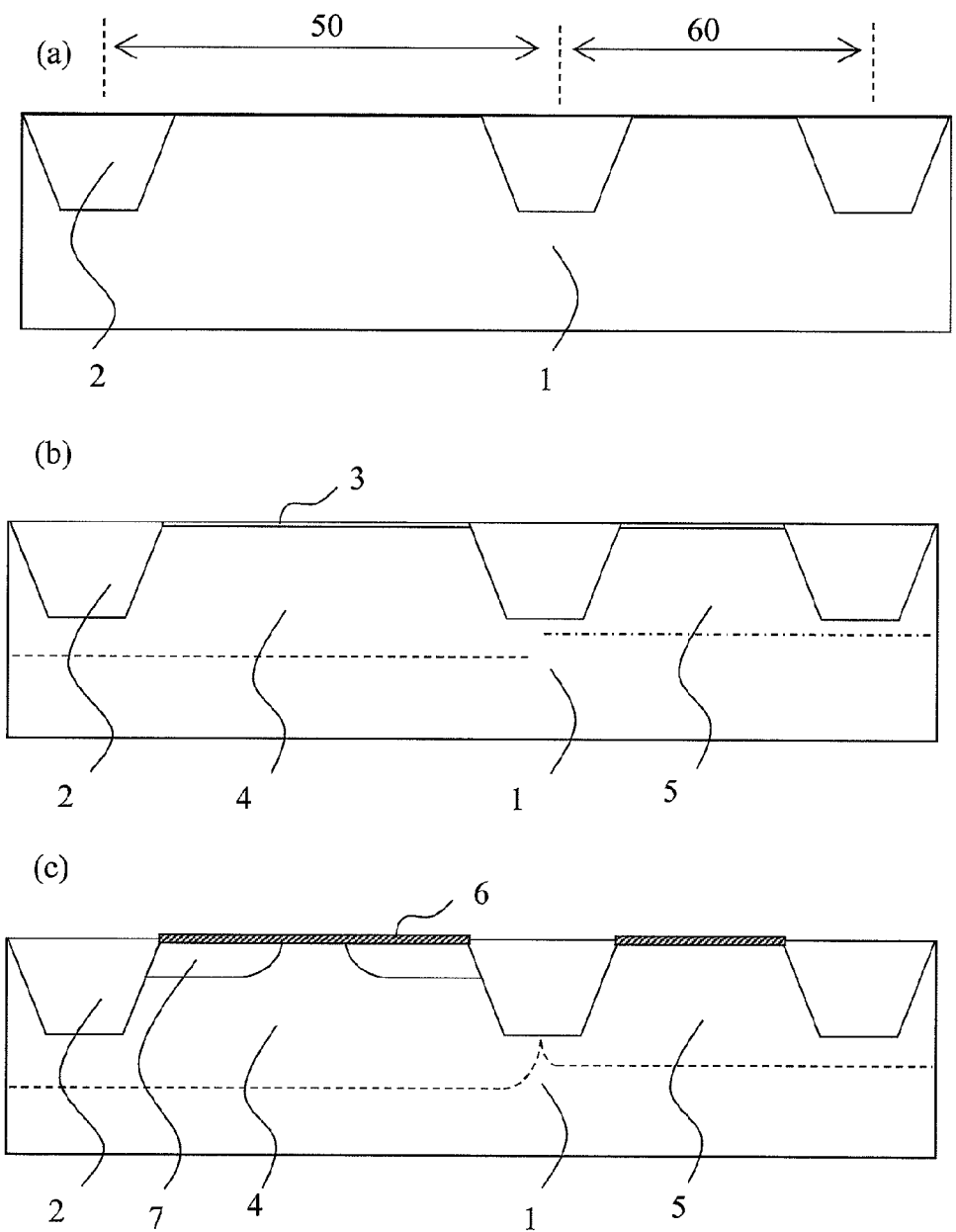
FIG. 2 is a view of a manufacturing process of the semiconductor device according to one embodiment of the present invention.
Figure 3:
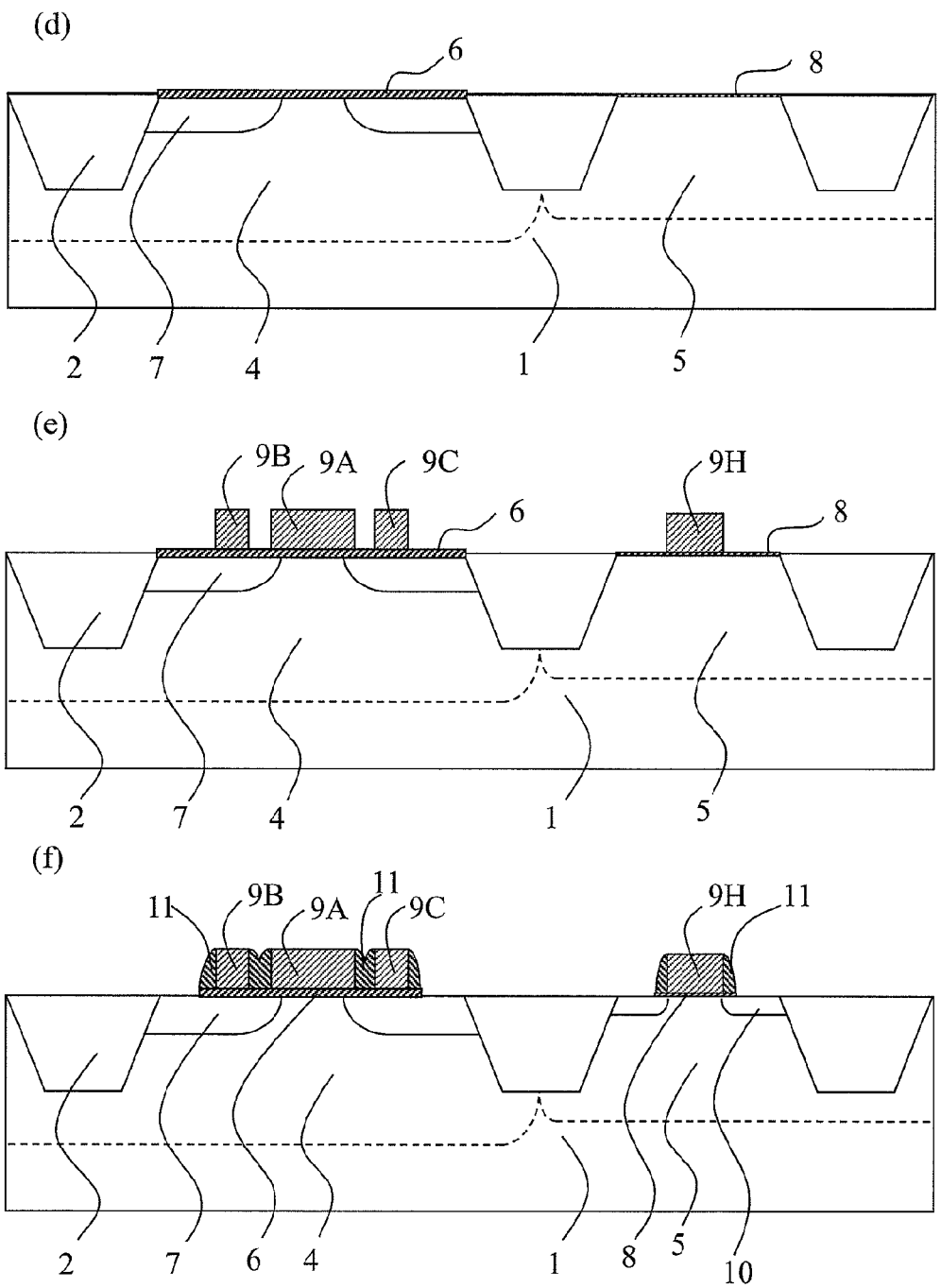
FIG. 3 is a view of a manufacturing process of the semiconductor device according to one embodiment of the present invention.
Figure 4:
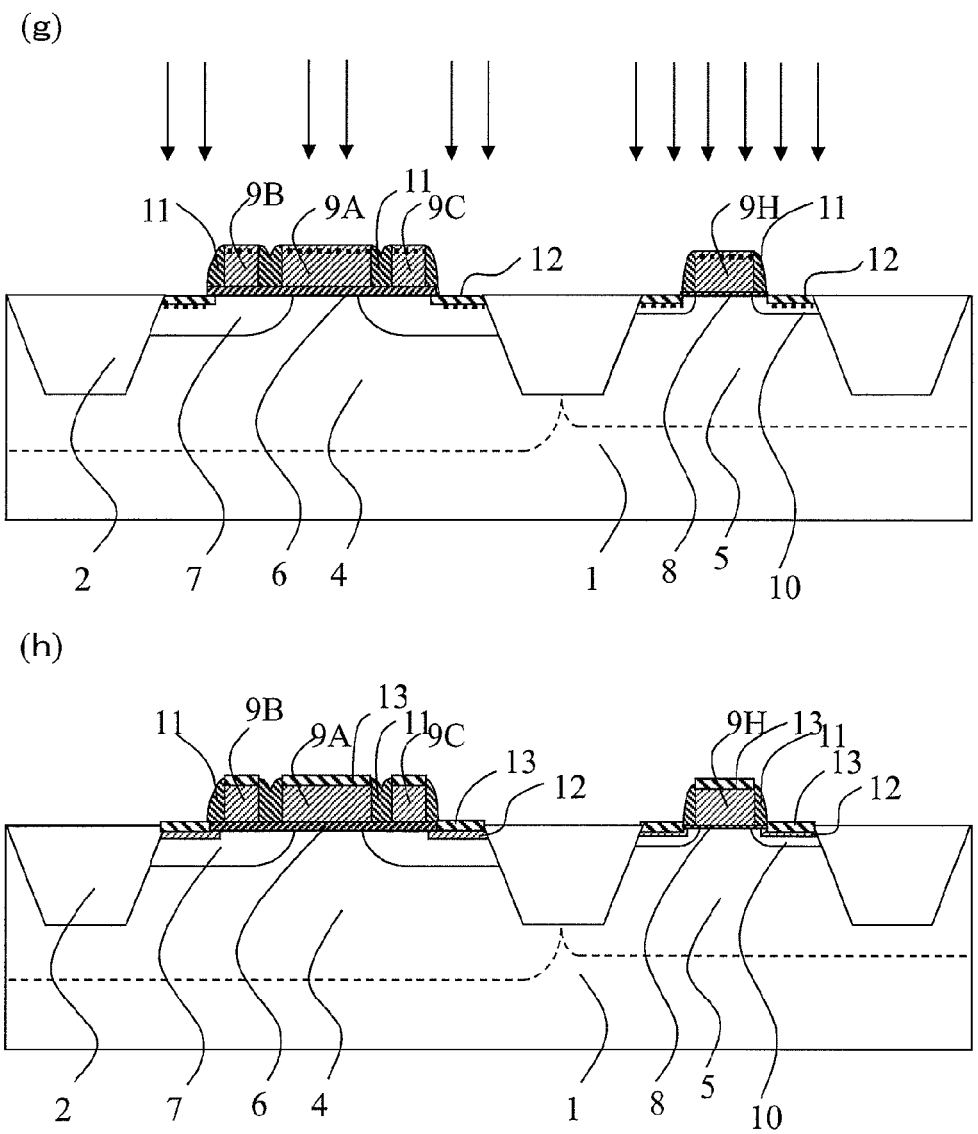
FIG. 4 is a view of a manufacturing process of the semiconductor device according to one embodiment of the present invention.
Figure 5:
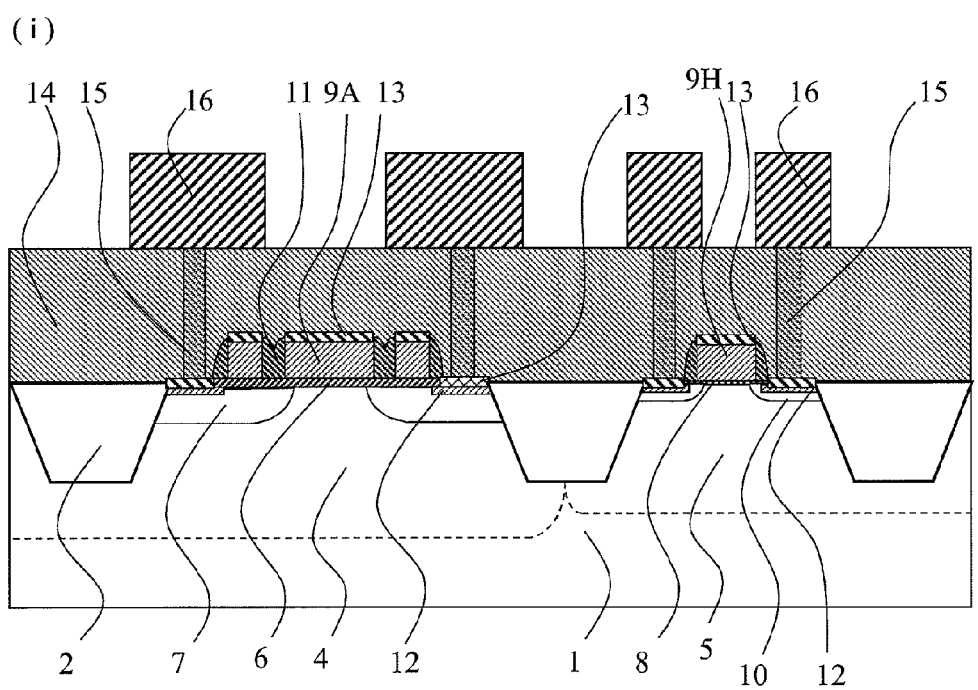
FIG. 5 is a view of a manufacturing process of the semiconductor device according to one embodiment of the present invention.

The semiconductor device comprises a first gate electrode formed above a semiconductor substrate through a gate insulating film; a second gate electrode that is formed above the semiconductor substrate through the gate insulating film, and that is arranged at the side of the first gate electrode through an insulating spacer; a source region and a drain region formed on the semiconductor substrate so as to sandwich the first and second gate electrodes; and an electric-field concentration easing region that is formed to sandwich some region of the semiconductor substrate below the first gate electrode, and that is formed to be overlapped with the second gate electrode and the source and drain regions.

Here, the semiconductor substrate comprises not only a substrate to which an impurity is implanted beforehand but also a substrate having a so-called well region that is formed by implanting an impurity into one or plural regions. The insulating spacer means an insulating member that fills the side face of the electrode or the space between the electrodes. A sidewall corresponds to the insulating spacer, for example. Any members can be used as the insulating spacer, so long as they have a function same as that of the sidewall, and its material is not particularly limited.

The electric-field concentration easing region means regions formed respectively on the source region and the drain region so as to sandwich a channel formed on some region of the semiconductor substrate below the first gate electrode. The electric-field concentration easing region means a region of the semiconductor substrate from the channel to the source region or the drain region. A part of this region is in contact with the channel, while the other portions of this region are in contact with the source region or the drain region. The electric-field concentration easing region is formed to include the impurity having the conductive type same as that of the source region and the drain region, and also to include an impurity of a conductive type reverse to that of the channel.

In one embodiment of the present invention, the second gate electrode comprises a plurality of electrodes, and the plurality of electrodes is arranged with the insulating spacer therebetween.

According to this embodiment, the distance between the first gate electrode and the source and drain regions can be increased, and the capacity between the second gate electrode and the source and drain regions can be reduced. In order to reduce the capacity described above, a line width of each of the plurality of electrodes may be smaller than a line width of the first gate electrode.

The width of the insulating spacer for the plurality of electrodes may be 0.3 microns or less. The spacer is made of an insulating film. When the width of the spacer is larger than 0.3 micron, the insulating film has to be formed to have a thickness larger than a general thickness (e.g., 0.05 to 0.15 micron), which entails a problem of increased manufacturing cost. Therefore, the width of the spacer is preferably not more than 0.3 micron.

In one embodiment of the present invention, the line width of the second gate electrode is larger than the line width of the first gate electrode.

According to this embodiment, the distance between the first gate electrode and the source and drain regions can be more increased. Therefore, this embodiment can provide a transistor suitable for a usage requiring high breakdown voltage.

In this embodiment, the second gate electrode may also comprises a plurality of electrodes, wherein the plurality of electrodes may be arranged with the insulating spacer therebetween. Further, the line width of each of the plurality of electrodes may be smaller than the line width of the first gate electrode.

In one embodiment of the present invention, the second gate electrode is arranged on the drain-region side of the first gate electrode, and is arranged only on the drain-region side.

According to this embodiment, the distance between the first gate electrode and the drain region can be increased, and the distance between the first gate electrode and the source region can relatively be decreased. Therefore, a more compact transistor can be designed, while easing the electric field concentration caused between the gate and the drain.

In one embodiment of the present invention, the semiconductor substrate and the first and second gate electrodes are made of a silicon material, and the first and second gate electrodes, the source region and the drain region each have a silicide layer formed on a surface thereof.

According to this embodiment, the resistance values of the gate electrode, the source region, and the drain region can be reduced. Therefore, the reduction in the resistance of the transistor and the high-speed operation of the transistor can be realized, while easing the electric field concentration.

In one embodiment of the present invention, the first gate electrode is electrically connected to a signal wiring that applies a potential to the first gate electrode, and the second gate electrode is electrically isolated from the first gate electrode and the signal wiring.

According to the this embodiment, the second gate electrode does not actively affect the source region and the drain region, whereby there is no need to consider the increase in the parasitic capacitance between the gate and the drain. Accordingly, the distance between the first gate electrode, and the source region and the drain region can be set larger. With this configuration, a transistor more suitable for a usage requiring high breakdown voltage can be provided.

In one embodiment of the present invention, the first gate electrode is electrically connected to the signal wiring, and the second electrode is electrically connected to the first electrode and the signal wiring.

According to this embodiment, when the potential from a control signal is applied to the first gate electrode, the same potential is also applied to the second gate electrode. Therefore, the concentration of the carrier in the electric field easing region on the surface of the semiconductor substrate is increased, whereby the reduction in the resistance of the transistor and the high-speed operation of the transistor can be realized.

In one embodiment of the present invention, the semiconductor substrate further comprises, in addition to the semiconductor device according to the above-mentioned invention, a second semiconductor device comprising a gate electrode that is formed above the semiconductor substrate through the gate insulating film and that is provided with an insulating spacer on its side face; second source region and drain region formed on the semiconductor substrate so as to sandwich the gate electrode; and a second electric field easing region that is formed so as to sandwich some region of the semiconductor substrate below the gate electrode, and to be overlapped with the second source region and drain region.

According to this embodiment, a high breakdown voltage semiconductor that can ease the electric field concentration and a low breakdown voltage semiconductor can be formed on the same semiconductor substrate. Therefore, the semiconductor substrate suitable for a display device can be provided.

A method of manufacturing a semiconductor substrate according to the present invention comprises: a step of forming a gate insulating film on a semiconductor substrate; a step of forming a photoresist film on the gate insulating film, and patterning the photoresist film such that the photoresist film covers a certain region on the semiconductor substrate; a first impurity implantation step of implanting an impurity, which has a conductive type reverse to that of the semiconductor substrate, into the semiconductor substrate with the patterned photoresist film being used as a mask; a step of removing the photoresist film after the first impurity implantation step; a step of forming a gate electrode film on the substrate from which the photoresist film is removed, and patterning the gate electrode film such that a first gate electrode is arranged on the certain region through the gate insulating film, and a second gate electrode is arranged on a region other than the certain region and at the side of the first gate electrode through a space; a step of forming an insulating film on the patterned first and second gate electrodes, and etching back the insulating film so as to form an insulating spacer on the side faces of the first and second gate electrodes and on the space between the first and second gate electrodes; and a second impurity implantation step of implanting an impurity, which has a conductive type same as that of the impurity, into the semiconductor substrate by using the first and second gate electrodes and the insulating spacer as a mask.

According to the method of manufacturing the semiconductor device of the present invention, the first gate electrode and the second gate electrode are formed, and the source region and drain region are formed by using the first gate electrode, the second gate electrode, and the insulating spacer as a mask, during the step of forming the gate electrode. Therefore, it is unnecessary to pattern a new layer on a top layer in order to increase the distance between the first gate electrode, and the source region and the drain region. Accordingly, a high breakdown voltage transistor can be manufactured with a more simple process. Since there is no need to pattern a new layer on the top layer, the method is less susceptible to the processing accuracy in a photolithography process, whereby a more compact semiconductor device can be manufactured.

A method of manufacturing a semiconductor substrate according to the present invention comprises: a first gate insulating film forming step of forming a gate insulating film on a semiconductor substrate that is separated into a first region and a second region by an isolation process; a step of forming a photoresist film on the gate insulating film, and patterning the photoresist film such that the photoresist film covers a certain region on the first region and the second region on the semiconductor substrate; a first impurity implantation step of implanting an impurity, which has a conductive type reverse to that of the semiconductor substrate, into the semiconductor substrate with the patterned photoresist film being used as a mask; a step of removing the photoresist film after the first impurity implantation step; a second gate insulating film forming step of removing the gate insulating film on the second region after the removal of the photoresist film, and forming a second gate electrode film, which is different from the gate insulating film, on the second region; a step of forming a gate electrode film on the substrate on which the second gate insulating film is formed, and patterning the gate electrode film such that a first gate electrode is arranged on the certain region on the first region through the gate insulating film, a second gate electrode is arranged on the region other than the certain region on the side face of the first gate electrode with a space, and a third gate electrode is arranged on the second region; a second impurity implantation step of implanting an impurity, which has a conductive type same as that of the impurity, into the second region on the semiconductor substrate by using the patterned gate electrodes as a mask; a step of forming an insulating film on the semiconductor substrate into which the impurity is implanted, and etching back the insulating film so as to form an insulating spacer on the side faces of the first to third gate electrodes and on the space between the first and second gate electrodes, after the second impurity implantation step; and a third impurity implantation step of implanting an impurity, which has a conductive type same as that of the impurity, into the semiconductor substrate by using the first to third gate electrodes and the insulating spacer as a mask.

According to the method of manufacturing the semiconductor device of the present invention, the first gate electrode, the second gate electrode, and the third gate electrode are formed, and the source region and drain region are formed by using the first gate electrode, the second gate electrode, the third gate electrode, and the insulating spacer as a mask, during the step of forming the gate electrode. Therefore, the high breakdown voltage transistor in which the distance between the first gate electrode, and the source region and the drain region is increased, and the low breakdown voltage transistor can be formed on the same semiconductor substrate.

The present invention will be described below in detail with reference to the drawings.

FIRST EMBODIMENT

FIG. 1 illustrates a semiconductor device according to a first embodiment of the present invention. FIG. 1 is a conceptual sectional view of the semiconductor device. As shown in FIG. 1, the semiconductor device 1 according to the present embodiment includes gate electrodes 9A, 9B, and 9C formed on a P-type semiconductor substrate 1 through a gate oxide film 6, N-type source/drain regions 12 formed so as to sandwich the gate electrodes 9A, 9B, and 9C; and N-type drift regions 7 that are formed so as to sandwich a part of the semiconductor substrate 1 below the gate electrode 9A, and that are overlapped with the gate electrodes 9B and 9C, and the N-type source/drain regions 12.

The semiconductor device 1 according to the present embodiment employs a silicon substrate 1 as the semiconductor substrate 1. A P-well region 4A is formed in the silicon substrate, and the semiconductor device 1 is formed in this region. A substrate having formed thereon one or plural regions into which a P-type or N-type impurity is doped may be used as the semiconductor substrate 1, or a substrate into which a P-type or N-type impurity is preliminarily doped in a predetermined concentration may be used. In the present embodiment, a silicon material is used for the semiconductor substrate 1 in order to form a later-described silicide layer 13. However, the material of the semiconductor substrate 1 is not particularly limited, so long as it can form a transistor (semiconductor device). The semiconductor substrate 1 is not limited to the silicon substrate. The semiconductor substrate 1 may be an elemental semiconductor such as germanium, a compound semiconductor (e.g., silicon germanium), or a substrate formed from polycrystalline silicon or amorphous silicon on a glass substrate.

As shown in FIG. 1, the gate oxide film 6 is formed on the semiconductor substrate 1. The gate oxide film 6 is formed below the gate electrodes 9A, 9B, and 9C so as to be in contact therewith in order to electrically isolate the gate electrodes 9A, 9B, and 9C from the semiconductor substrate 1. The gate oxide film 6 extends to the side of the N-type source/drain regions 12 from the portion below the gate electrodes 9A, 9B, and 9C.

The gate oxide film 6 is formed from a silicon oxide film. The gate oxide film 6 is not particularly limited, so long as it can electrically isolate the gate electrodes from the semiconductor substrate. For example, the gate oxide film 6 may be formed from a single-layer film such as a silicon nitride film, or a laminate film composed of a silicon oxide film and a silicon nitride film.

The thickness of the gate oxide film 6 can appropriately be changed according to the required characteristic of the transistor, or an operation voltage. In the present embodiment, the gate oxide film 6 has a thickness of 45 nm, since the semiconductor device according to the present embodiment is a high breakdown voltage transistor. The transistor for the usage requiring high breakdown voltage may preferably have a thickness of 30 to 60 nm, for example.

As shown in FIG. 1, the gate electrodes 9A, 9B, and 9C are formed on the gate oxide film 6, and the silicide layer 13 is formed thereon. The gate electrodes 9A, 9B, and 9C are arranged such that the gate electrodes 9B and 9C are formed at both sides of the gate electrode 9A at the center through sidewalls 11 on the side faces of the gate electrode 9A.

The gate electrode 9A is an electrode for controlling an electric current flowing between the source and drain of the transistor, and corresponds to a gate electrode of a normal transistor. Specifically, the gate electrode 9A has a channel on a certain region of the semiconductor substrate below the gate electrode 9A.

On the other hand, the gate electrodes 9B and 9C are not the electrodes for positively controlling the electric current flowing between the source and drain of the transistor, but so-called pseudo gate electrodes. Specifically, the gate electrodes 9B and 9C can change the electric resistance of the N-type drift regions 7 by applying an electric field to the later-described N-type drift regions 7. The channel is not present below the gate electrodes 9B and 9C.

The gate electrodes 9A, 9B, and 9C have the sidewalls 11 on their side faces. The gate electrodes 9A, 9B, and 9C are isolated from one another with the sidewalls 11. As viewed from top, the gate electrodes 9A, 9B, and 9C are isolated from one another on the region (the region where the channel is present) between the paired N-type source/drain regions 12 with the sidewalls 11.

With the structure of the gate electrodes 9A, 9B, and 9C described above, the gate electrode 9A can serve as the gate electrode for controlling the electric current flowing between the source and drain of the transistor, while the gate electrodes 9B and 9C cannot serve as the gate electrode described above. Specifically, the gate electrodes 9B and 9C do not positively control the electric current between the source and the drain of the transistor. The boundary between the later-described N-type drift regions 7 and the channel is formed in the vicinity of the portion below the side faces of the gate electrode 9A, and is arranged apart from the gate electrodes 9B and 9C. Therefore, the gate electrode 9A eases the electric field concentration between the gate electrode 9A and the drain, while the gate electrodes 9B and 9C hardly affect the electric field concentration between the gate electrode 9A and the drain. Accordingly, the gate electrodes 9B and 9C greatly contribute to increase the distance between the gate electrode 9A and the source/drain diffusion regions 12. The electric field can be applied between the gate electrode 9A and the drain through the N-type drift region 7.

The gate electrodes 9A, 9B, and 9C include a polysilicon film, and are made of the same layer. In the present embodiment, the gate electrodes 9A, 9B, and 9C have the same layer, i.e., have the same layer structure, so that they can be formed with the same process. Accordingly, it is unnecessary to pattern a new layer for forming an offset region during the formation of the later-described N-type source/drain diffusion layers 12.

These gate electrodes are made of a silicon material, considering that the silicide layer 13 is formed on the gate electrodes 9A, 9B, and 9C for attaining low resistance. However, if the silicide layer 13 is not formed, these gate electrodes may be made of a conductive material generally used for an electrode. For example, a metal material such as aluminum, copper, gold, platinum, tungsten, tantalum, or titanium may be used. The gate electrodes 9A, 9B, and 9C may have a single-layer structure, or multilayer structure.

The sidewalls 11 are formed on the side faces of the gate electrodes 9A, 9B, and 9C for filling the spaces between the gate electrode 9A, and the gate electrodes 9B and 9C. In the present embodiment, the sidewalls 11 are made of a silicon oxide film.

The thickness of each of the sidewalls 11 has to be ½ or more of the spaces in order to fill the spaces between the gate electrode 9A and the gate electrodes 9B and 9C. Therefore, in the present embodiment, the sidewall 11 is formed to have a thickness of 0.15 micron or more with respect to the spaces, each having 0.3 micron, between the gate electrode 9A and the gate electrodes 9B and 9C. Since the sidewalls 11 fill the spaces between the gate electrode 9A and the gate electrodes 9B and 9C, the gate electrodes 9A, 9B, and 9C and the sidewalls 11 can serve as a layer for forming the offset region during the formation of the later-described N-type source/drain diffusion regions 12.

The material for the sidewalls 11 is not particularly limited, so long as it is an insulating material, i.e., a material having the function same as the function of the sidewalls for filling the side face of the electrode or the space between the electrodes. For example, an insulating film such as a silicon nitride film can be used.

The silicide layer 13 is formed on the surfaces of the gate electrodes 9A, 9B, and 9C. The silicide layer 13 is formed for reducing the resistance of the gate electrodes. In the present embodiment, the silicide layer 13 is made of a material of titanium silicon ($TiSi_2$). In the present embodiment, the silicide layer 13 is also formed on the later-described N-type source/drain regions 12. The silicide layer 13 can simultaneously be formed in a self-aligned manner on the gate electrodes and the source/drain regions in the manner such that the gate electrodes 9A, 9B, and 9C and the N-type source/drain regions 12 are made of a silicon material (silicon, polysilicon), and they are subject to a silicide reaction with a high melting point metal. Therefore, the silicide layer may preferably be formed on both the gate electrodes 9A, 9B, and 9C and the N-type source/drain regions 12. Even if the silicide layer 13 is simultaneously formed on the gate electrodes 9A, 9B, and 9C and the N-type source/drain regions 12, an electrical short circuit does not occur between the gate electrodes 9A, 9B, and 9C and the N-type source/drain regions 12 by the sidewalls 11 on the side faces of the gate electrodes 9A, 9B, and 9C. Accordingly, the resistances of the gate electrodes and the source/drain regions can easily be reduced, which is advantageous for enhancing the characteristic of the transistor.

Instead of silicon titanium ($TiSi_2$) described above, a compound of high melting point metal such as tungsten or molybdenum and silicon ($WSi_2$, $MoSi_2$), and a compound of a noble metal such as cobalt, nickel, or platinum and silicon ($CoSi_2$, $NiSi_2$, $PtSi_2$) may be used for the silicide layer 13.

As shown in FIG. 1, the N-type source/drain regions 12 are formed on the semiconductor substrate 1, on which the gate electrodes 9A, 9B, and 9C are formed, so as to sandwich the gate electrodes 9A, 9B, and 9C, and the N-type drift regions 7 are formed so as to sandwich a part of the semiconductor substrate 1 below the gate electrode 9A, and to be overlapped with the gate electrodes 9B and 9C and the N-type source/drain regions 12.

The N-type source/drain region 12 is formed on the semiconductor substrate 1 between the portion below the side face of the sidewall 11 at the left (FIG. 1) of the gate electrode 9B and the isolation region 2. The N-type source/drain region 12 is formed on the semiconductor substrate 1 between the portion below the side face of the sidewall 11 at the right (FIG. 1) of the gate electrode 9C and the isolation region 2. The silicide layer is formed on the surfaces of the N-type source/drain regions 12.

In the present embodiment, the N-type source/drain region 12 is formed by doping an N-type impurity, which has a conductive type reverse to that of the semiconductor substrate 1 (P-type), into the semiconductor substrate. Specifically, the N-type source/drain region 12 is formed by implanting an N-type high-concentration impurity (about $1\times10^{15}$ to $1\times10^{16}$ $cm^{-3}$) into the semiconductor substrate with the gate electrodes 9A, 9B, and 9C and the sidewalls 11 being used as a mask. With this process, the ion implantation can simultaneously be done to the gate electrodes 9A, 9B, and 9C, and the N-type source/drain region 12, as well as the N-type source/drain regions 12 can be formed between the portion below the side faces of the sidewalls 11 and the side faces of the isolation regions 2 in a self-aligned manner.

In the present embodiment, the gate electrodes 9B and 9C and the sidewalls 11 are formed in order to increase the distance between the gate electrode 9A and the N-type source/drain regions 12. Therefore, it is unnecessary to form a new layer on the gate electrode 9A or the N-type source/drain regions 12. Accordingly, there is no hindrance of the ion implantation to the gate electrodes 9A, 9B, and 9C and the N-type source/drain regions 12 whereby the uniform ion implantation can be done. With this, the gate electrodes 9A, 9B, and 9C and the N-type source/drain regions 12 having uniform electrical characteristic can be formed.

The silicide layer 13 is formed to reduce the resistances of the N-type source/drain regions 12, as in the gate electrode. In the embodiment shown in FIG. 1, the silicide layer 13 is made of a material of silicon titanium ($TiSi_2$). As described above, in the present embodiment, the silicide layer can simultaneously be formed on the gate electrodes and the source/drain regions in a self-aligned manner.

The N-type drift regions 7 are formed to sandwich a part of the semiconductor substrate below the gate electrode 9A, i.e., the N-type drift regions 7 are formed on both sides of the channel. The N-type drift regions 7 are formed below the gate electrodes 9B and 9C as being overlapped with the gate electrodes 9B and 9C via the gate oxide film 6. The N-type drift regions 7 are also formed to be in contact with the N-type source/drain regions 12 and to be overlapped with the same regions 12.

The N-type drift regions 7 are formed by doping an N-type impurity, which has a conductive type reverse to that of the semiconductor substrate 1 (P-type), into the semiconductor substrate. The concentration of the N-type impurity is lower than the concentration of the impurity doped into the N-type source/drain regions 12 with which the N-type drift regions 7 are in contact. For example, the N-type drift regions 7 are formed by the ion implantation of the N-type impurity with the concentration of about $3 \times 10^{12}$ to $1.2 \times 10^{13}$ cm$^{-3}$ in the present embodiment. The N-type drift regions 7 are electrically connected to the N-type source/drain regions 12 through a contact to the N-type source/drain regions 12, thereby easing the electric field concentration. The N-type drift regions 7 are formed below the gate electrodes 9B and 9C as being overlapped with these electrodes through the gate oxide film 6, whereby the distance between the gate electrode 9A and the N-type source/drain regions 12 can be increased. Therefore, the electric field concentration caused between the N-type source/drain regions 12 and the gate electrode 9A can be eased.

As shown in FIG. 1, the N-type source/drain regions 12 are connected to metal wirings 16 through contact electrodes 15 formed on an interlayer dielectric film 14. The electric current is supplied from the metal wirings 16 to the source/drain regions, and the gate electrode 9A controls this current. With this, the transistor (semiconductor device) can serve its function.

(Manufacturing Method)

The manufacturing method of the semiconductor device according to the first embodiment of the present invention will be described next. FIGS. 2, 3, 4, and 5 are sectional views of a semiconductor substrate during each step of the manufacturing method of the semiconductor device according to the present embodiment. These figures show the manufacturing method when the high breakdown voltage nMOS transistor described in the first embodiment and a low breakdown voltage nMOS transistor are manufactured on the same semiconductor substrate. In these figures, a high breakdown voltage MOS transistor forming region 50 is shown at the left side, while a low breakdown voltage MOS transistor forming region 60 is shown at the right side.

As shown in FIG. 2(a), the isolation region 2 is formed to have a depth of 0.3 to 1.0 micron on the P-type semiconductor substrate 1 by a known STI technique (Shallow Trench Isolation) or a LOCOS (Local Oxidation of Silicon). The region between two isolation regions 2 is specified as an active region. As shown in FIG. 2(a), the region between the isolation region 2 at the left side in the figure and the isolation region 2 at the center becomes the active region 50 where the high breakdown voltage nMOS transistor is to be formed, while the region between the isolation region 2 at the center and the isolation region 2 at the right side becomes the active region 60 where the low breakdown voltage nMOS transistor is to be formed.

Next, as shown in FIG. 2(b), a pad oxide film 3 is formed to have a thickness of 5 to 20 nm on the active regions between two isolation regions 2, and then, a high breakdown voltage P-type well region 5 and a low breakdown voltage P-type well region 5 are respectively formed below the pad oxide film 3 by a known photolithography technique, ion implantation technique or anneal technique.

Then, as shown in FIG. 2(c), a high breakdown voltage gate oxide film (gate insulating film) 6 and the N-type drift regions 7 are formed.

Firstly, the high breakdown voltage gate oxide film (gate insulating film) 6 is formed to have a thickness of 30 to 60 nm in an oxygen atmosphere of 800 to 1000° C. For example, oxygen, nitrogen-containing oxygen, or halogen added oxygen (HCl or DCE (dicycloethylene) is used for the oxygen atmosphere. The thickness of the high breakdown voltage gate oxide film 6 is determined according to the operating range of the transistor.

Then, the N-type drift region 7 serving as the electric field easing diffusion layer is patterned and formed on the high breakdown voltage P-type well region 4 with a known photolithography technique. For example, phosphor (P), which is an N-type impurity, is ion-implanted with implant energy of 80 to 150 keV, and a dose amount of $3 \times 10^{12}$ to $1.2 \times 10^{13}$ (ions/cm$^2$), whereby the N-type drift region 7 is formed. This N-type drift region 7 serves as the electric field easing region in the high breakdown voltage nMOS transistor, and is arranged so as to sandwich a part of the high breakdown voltage P-type well region 4, which region corresponds to the region below the later-described gate electrode. This region corresponds to the channel region below the gate electrode.

Then, as shown in FIG. 3(d), a gate oxide film 8 for the low breakdown voltage transistor is formed. Firstly, the high breakdown voltage gate oxide film 6 is removed from the low breakdown voltage MOS transistor forming region 60. Then, the gate oxide film 8 for the low breakdown voltage transistor is formed to have a thickness of 3 to 8 nm on the low breakdown voltage MOS transistor forming region 60. The low breakdown voltage transistor is a transistor operated with 1.8 to 3.3 V, for example, and the thickness of the gate oxide film 8 is determined in consideration of the operating range.

Next, as shown in FIG. 3(e), the gate electrodes 9A, 9B, 9C, and 9H are formed.

Firstly, a polysilicon film for the gate electrodes is deposited with a thickness of 150 to 350 nm on both regions of the high breakdown voltage MOS transistor forming region 50 and the low breakdown voltage MOS transistor forming region 60, i.e., on the whole surface.

Next, the gate electrodes 9A, 9B, and 9C for the high breakdown voltage nMOS transistor and a gate electrode 9H for the low breakdown voltage nMOS transistor are simultaneously formed by using a predetermined resist pattern with a known photolithography technique. The gate electrodes by use of the resist pattern are formed with the pattern in which the N-type drift region 7 formed in the process shown in FIG. 2(c) is arranged at both sides of the portion below the gate electrode 9A. Considering the processing accuracy in the photolithography technique, the pattern is formed such that the gap between the gate electrode 9A and the gate electrodes 9B and 9C having the N-type drift regions 7 formed below them is 0.3 μm or less.

Next, as shown in FIG. 3(f), an LDD region 10 and sidewalls 11 are formed.

Firstly, the high breakdown voltage MOS transistor forming region 50 is covered with a resist pattern, and the gate electrode 9H on the low breakdown voltage MOS transistor forming region 60 and the isolation region 2 are used as a mask. With this state, the LDD region 10 (LDD: Lightly Doped Drain) for the low breakdown voltage transistor is formed in a self-aligned manner with the known photolithography technique. For example, phosphor (P) that is the N-type impurity is used for forming the LDD region 10.

Then, the resist pattern covering the high breakdown voltage MOS transistor forming region 50 is removed, and then, an insulating film is deposited on the high breakdown voltage MOS transistor forming region 50 and the low breakdown voltage MOS transistor forming region 60. The deposited insulating film, the gate oxide film 6, and the gate oxide film 8 are etched back, whereby the sidewalls 11 are formed on the gate electrode 9H in a self-aligned manner. During this process, the similar sidewalls 11 are also formed on the gate electrodes 9A, 9B, and 9C on the high breakdown voltage NMOS transistor forming region 50. Specifically, the sidewalls 11 are formed on the side faces of the gate electrodes 9B and 9C, and the gap between the gate electrode 9A and the gate electrodes 9B and 9C are filled by the insulating film that forms the sidewalls 11. The thickness of the insulating film forming the sidewalls 11 has to be ½ or more of the gap between the gate electrode 9A an the gate electrodes 9B and 9C.

As shown in FIG. 4(g), the N-type source/drain regions 12 are formed in a self-aligned manner by using the gate electrodes 9A, 9B, 9C, and 9H, the sidewalls 11, and the isolation region 2 as a mask with the ion implantation technique. For example, arsenic (As) that is the N-type impurity is ion-implanted with implant energy of 40 keV, and a dose amount of $1 \times 10^{15}$ to $1 \times 10^{16}$ (ions/cm$^2$), whereby the high-concentration N-type source/drain regions are formed for drawing electric current to the electrode 16.

During the ion implantation process, the N-type impurity is also implanted not only to the N-type source/drain regions 12 but also to the gate electrodes 9A, 9B, 9C, and 9H, whereby the resistance values thereof are controlled. In the present embodiment, the N-channel transistor is described as one example. However, when a P+ region (substrate contact) or PMOS and the N-channel transistor are manufactured on the same semiconductor substrate, the known photolithography technique is used.

Next, the impurity implanted with the ion implantation is activated by a heat treatment. For example, the impurity is activated by an annealing using a heat diffusion furnace at a temperature of 800 to 900° C. for about 10 to 20 minutes, or by an RTA process at 900 to 1050° C. for about 10 to 60 seconds.

As shown in FIG. 4(h), the silicide layer having low resistance is formed in a self-aligned manner on the gate electrodes 9 and the N-type source/drain diffusion regions 12.

Firstly, the insulating film on the conductive film (gate electrodes 9 and the N-type source/drain diffusion regions 12) that is exposed to the surface is removed by predetermined HF chemical. Then, a high melting point metal such as Ti is deposited on both regions of the high breakdown voltage NMOS transistor forming region 50 and the low breakdown voltage NMOS transistor forming region 60, i.e., on the whole surface, by a sputtering process or CVD process, and then, the RTA process (Rapid Thermal Annealing) is performed at 400 to 700° C. for about 30 to 90 seconds. With this process, the silicide reaction is caused between the conductive film (Si of the N-type source/drain diffusion regions 12 and PolySi of the gate electrodes 9) and the high melting point metal. Instead of Ti, Co or Ni may be used for the high melting point metal.

Next, the unreacted high melting point metal (e.g., Ti) on the surface of the isolation region 2 and the surfaces of the sidewalls 11 are removed by $H_2SO_4$ chemical. Further, a layer transition is performed to form the silicide layer 13. For example, the layer transition is performed by the RTA process at 600 to 900° C. for about 20 to 40 seconds to form the silicide layer 13 having low resistance.

Then, as shown in FIG. 5(i), the electrode 16 is formed through an interlayer dielectric film 14. Firstly, the interlayer dielectric film 14 is formed by the CVD process, and then, a part of the interlayer dielectric film 14 is opened to form a contact hole 15. The contact hole 15 is filled with a metal, and a metal film is deposited on the interlayer dielectric film 14 with a known technique. This metal film is patterned to form the electrode 16. With this process, the low-resistance silicide layer 13 on the N-type source/drain diffusion regions 12 and the electrode 16 are connected. Thus, the semiconductor device according to the present embodiment is completed.

In the present embodiment, the N-channel transistor is described as one example. However, the present invention is applicable to a P-channel transistor, wherein the type of the impurity in all regions is changed.

SHAPE OF FIRST EMBODIMENT

The planar shape of the semiconductor device according to the first embodiment of the present invention will be described next.

Figure 6:
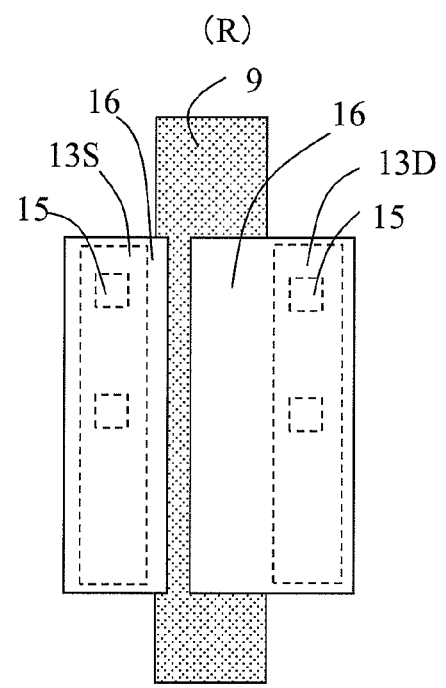
FIG. 6 is a plan view of a semiconductor device having a conventional structure, and a semiconductor device according to a first embodiment of the present invention.
Figure 6:
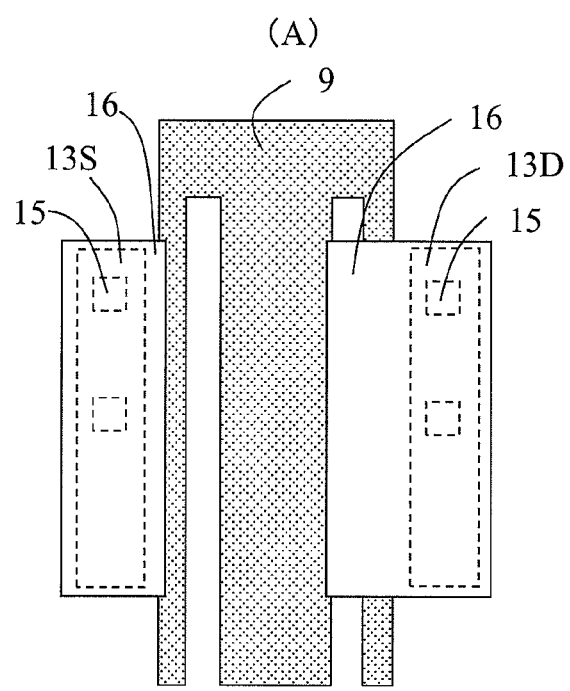
Figure 7:
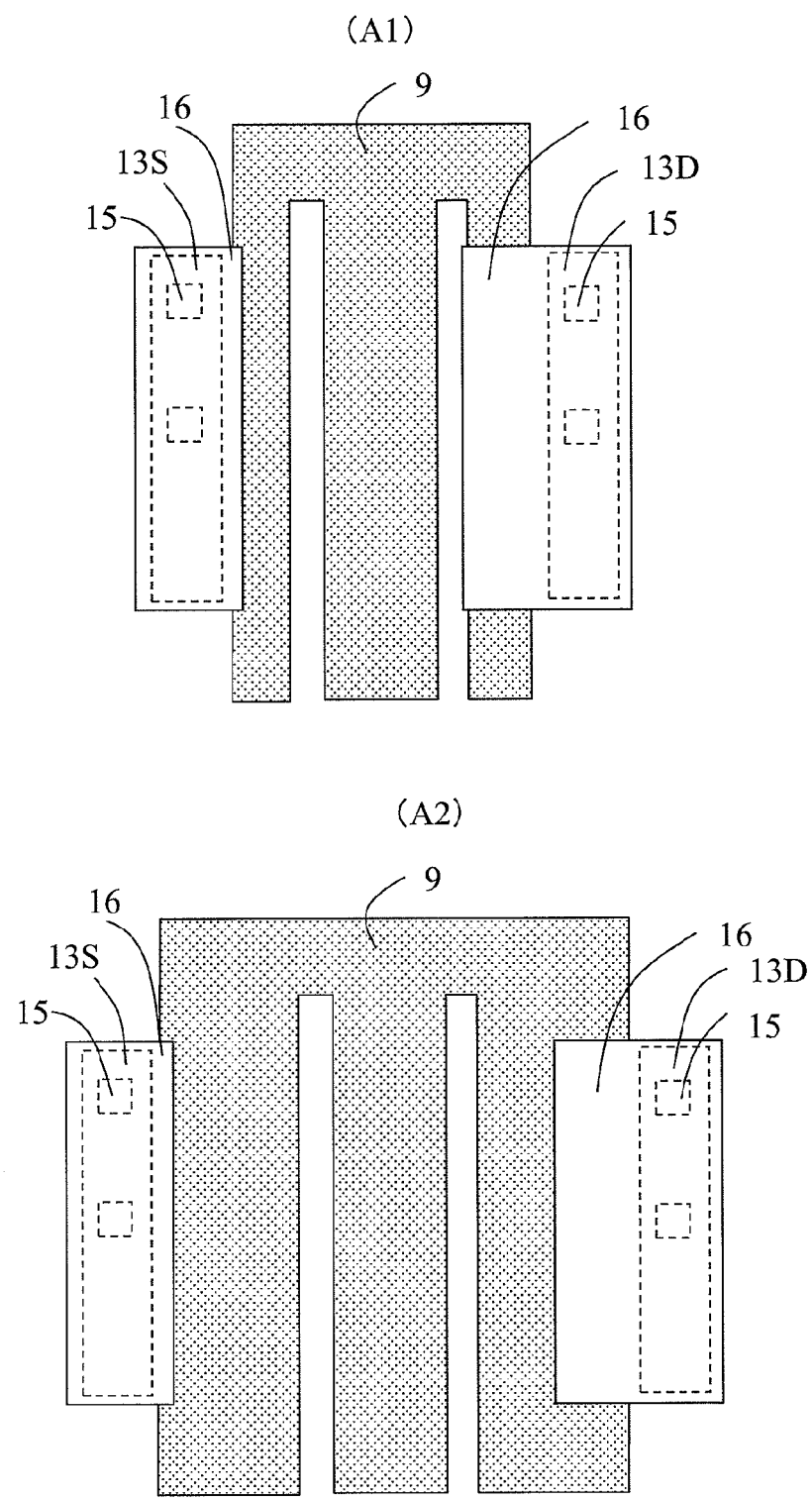
FIG. 7 is a plan view conceptually illustrating a semiconductor device according to a modification of the first embodiment of the present invention.
Figure 14:
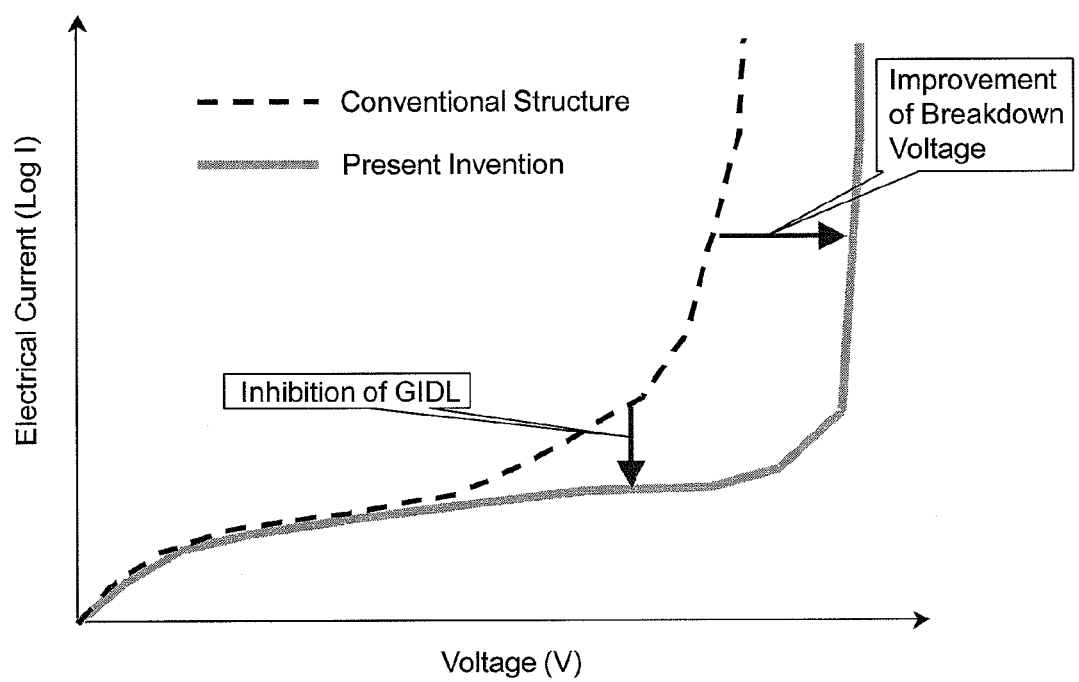
FIG. 14 is a schematic graph showing electrical characteristics of the semiconductor device having the conventional structure and the semiconductor device according to the first embodiment of the present invention.
Figure 15:
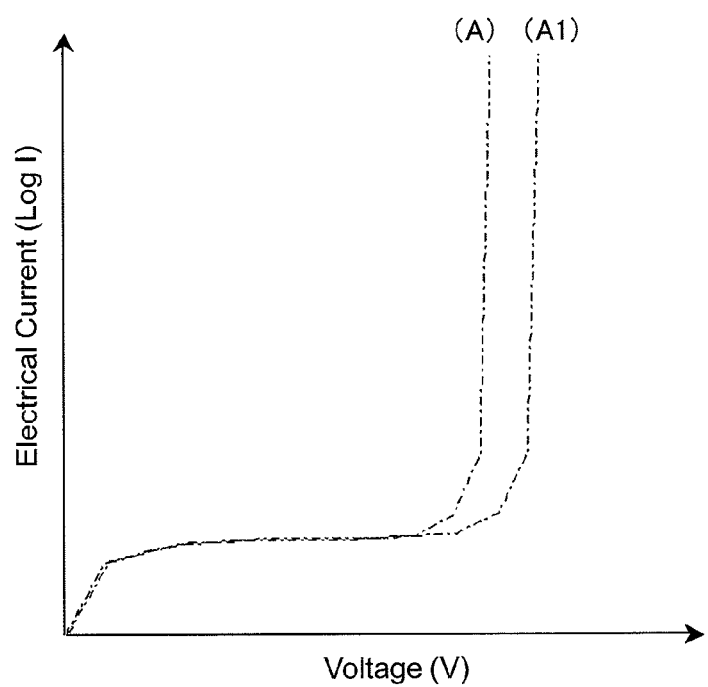
FIG. 15 is a schematic graph showing electrical characteristics of the semiconductor devices according to the first embodiment and the modification of the first embodiment of the present invention.

FIG. 6 illustrates a semiconductor device having a conventional structure and the semiconductor device according to the first embodiment of the present invention. FIG. 7 illustrates a modification of the semiconductor device according to the first embodiment. FIGS. 14 and 15 show electric characteristics of these devices. FIGS. 6 and 7 are conceptual plan views of these semiconductor devices. FIG. 6(R) illustrates the structure of the conventional semiconductor device, while FIG. 6(A) illustrates the structure of the semiconductor device according to the first embodiment. FIG. 7(A1) illustrates the structure of the modification of the first embodiment, while FIG. 7(A2) illustrates the structure of another modification of the first embodiment. FIG. 14 is a graph showing drain-to-source breakdown voltage characteristics of the semiconductor device having the conventional structure and the semiconductor device according to the first embodiment. FIG. 15 is a graph showing drain-to-source breakdown voltage characteristics of the semiconductor device according to the first embodiment and its modification. In FIGS. 14 and 15, an abscissa axis indicates the voltage between the source and drain, while an ordinate axis indicates a drain current (expressed as logarithm).

The planar shape of the semiconductor device having the conventional structure and the planar shape of the semiconductor device according to the first embodiment will firstly be described with reference to FIG. 6.

As shown in FIG. 6(R), the conventional semiconductor device includes a gate electrode 9, a source-side silicide layer 13S and a drain-side silicide layer 13D, which are formed on both sides of the gate electrode 9, and a metal wiring 16 that is in contact with the source-side silicide layer 13S or the drain-side silicide layer 13D through a contact electrode 15. A source/drain diffusion region 12 (not shown) is formed below the source-side silicide layer 13S and the drain-side silicide layer 13D, and a drift region 7 (not shown) is formed below the source/drain diffusion region 12 so as to be in contact with the source/drain diffusion region 12 over the lower portion of the side face of the gate electrode 9. The gate electrode 9 is electrically connected to a signal wiring that applies a potential and controls the same (not shown).

On the other hand, in the semiconductor device according to the first embodiment, the shape of the gate electrode is different from that of the conventional one as shown in FIG. 6(A). Specifically, the gate electrode 9 of the semiconductor device according to the first embodiment includes the first gate electrode 9A that is located on middle between the paired two source/drain diffusion regions 12, and second electrodes 9B and 9C formed on both sides of the central electrode with a space. The first electrode 9A and the second electrodes 9B and 9C are connected to each other at the outside of the region sandwiched by the source/drain diffusion regions. In other words, the gate electrode 9 is configured to be branched into the first electrode 9A and the second electrodes 9B and 9C at the outside of the region sandwiched by the source/drain diffusion regions, wherein the first electrode 9A and the second electrodes 9B and 9C are connected with a bridge 9S to form a fork-like shape. The space between the fork-like electrodes is filled with the sidewalls (not shown). The section taken along a line X-X in FIG. 6(A) corresponds to the sectional view in FIG. 1.

As shown in FIG. 14, when the voltage between the source and the drain increases, the drain current gradually increases from the vicinity of the center of the abscissa axis in FIG. 14 in the conventional semiconductor device. On the other hand, in the semiconductor device according to the first embodiment, the drain current does not increase so much up to the right side of the abscissa axis in FIG. 14, even if the voltage between the source and the drain increases. This is considered because of the reason described below. Compared to the conventional semiconductor device, the distance between the first gate electrode and the source/drain diffusion regions is large, and the electric field is applied to the source/drain diffusion regions from the first gate electrode through the drift region 7, in the semiconductor device according to the first embodiment. Therefore, GIDL (Gate Induced Drain Leakage) due to the electric field concentration caused between the gate and the drain is improved.

In the conventional semiconductor device and the semiconductor device according to the first embodiment, there is a voltage region where a lot of drain current flows regardless of the voltage between the source and the drain, when the voltage between the source and the drain is increased. It is found from FIG. 14 that the voltage between the source and the drain by which this region is formed is high in the semiconductor device according to the first embodiment, compared to the conventional semiconductor device. Specifically, the semiconductor device according to the first embodiment is excellent in breakdown voltage characteristic.

In the semiconductor device according to the first embodiment in which the first electrode 9A at center and the second electrodes 9B and 9C on both sides of the first electrode 9A are connected to each other at the outside of the region sandwiched by the source/drain diffusion regions, voltage is applied not only to the first electrode 9A but also to the second electrodes 9B and 9C. Therefore, the electric field by the second electrodes 9B and 9C is generated on the drift region 7 below the second electrodes, whereby the electrical resistance of the drift region 7 is reduced.

MODIFICATION OF FIRST EMBODIMENT

The modification of the first embodiment will next be described with reference to FIG. 7. As shown in FIG. 7(A1), the components in the modification of the first embodiment are arranged on the same positions as those of the semiconductor device according to the first embodiment as shown in FIG. 6(A) (e.g., the channel region is present below the first electrode 9A). However, in the modification, the shapes of the second electrodes 9B and 9C provided on both sides of the first electrode 9A, which is located in the vicinity of the center between the source/drain diffusion regions 12, with a space from the first electrode 9A are different. Specifically, the line widths of the second electrodes 9B and 9C in this modification are larger than those in the embodiment shown in FIG. 6(A). The semiconductor device according to another modification shown in FIG. 7(A2) has the same structure as the structures of the semiconductor devices according to the first embodiment and the modification of the first embodiment. However, the line widths of the second electrodes 9B and 9C are larger than those of the second electrodes in the semiconductor device according to the first embodiment and in the semiconductor device according to the modification of the first embodiment. The line widths of the second electrodes 9B and 9C provided on both sides of the first electrode 9A are larger than the line width of the first electrode 9A at the center in the semiconductor device according to another modification shown in FIG. 7(A2).

Comparing the modification (FIG. 7(A1)) according to the first embodiment and the semiconductor device (FIG. 6(A)) according to the first embodiment, the semiconductor device according to the modification of the first embodiment is excellent in breakdown voltage characteristic as shown in FIG. 15. Specifically, it is found from the drain-to-source breakdown voltage characteristic shown in FIG. 15 that the voltage in the voltage region by which a lot of drain current flows is higher in the modification of the first embodiment than in the semiconductor device according to the first embodiment, regardless of the voltage between the source and the drain.

This is considered because of the reason described below. Specifically, the distance between the first gate electrode and the source/drain diffusion regions is larger in the modification of the first embodiment than in the semiconductor device according to the first embodiment, whereby the GIDL due to the electric field concentration caused between the source and the drain is improved, and hence, the semiconductor device according to the modification of the first embodiment is excellent in the breakdown voltage characteristic.

SECOND AND THIRD EMBODIMENTS

Semiconductor devices according to second and third embodiments of the present invention will be described next.

Figure 8:
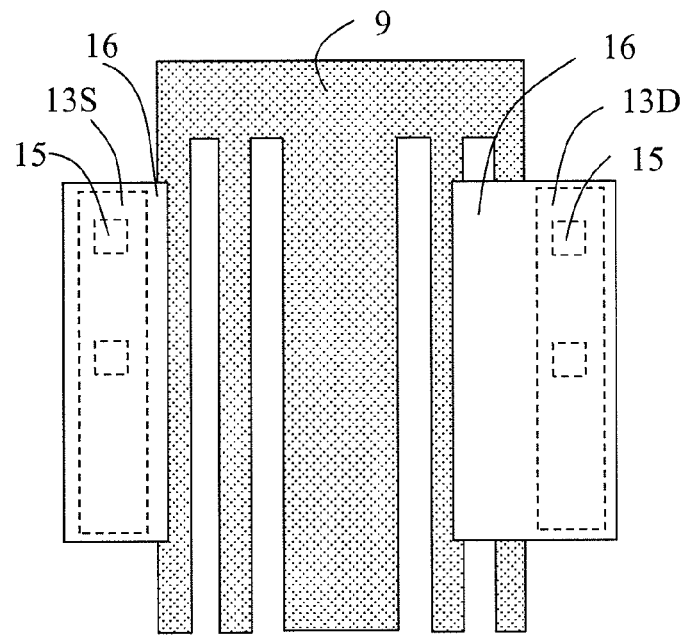
FIG. 8 is a plan view conceptually illustrating semiconductor devices according to a second embodiment and a third embodiment of the present invention.
Figure 8:
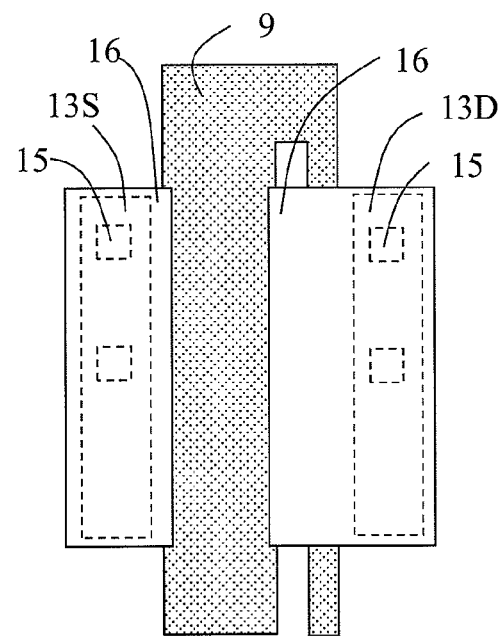
Figure 16:
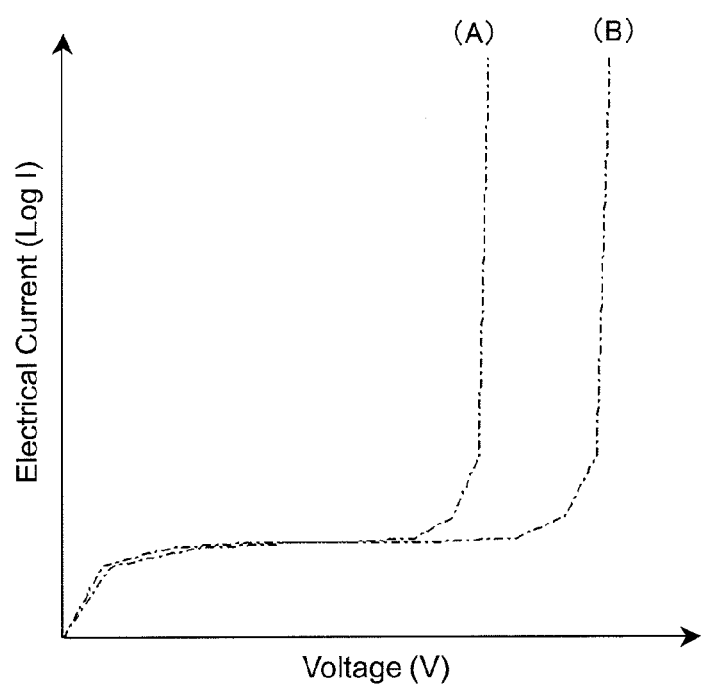
FIG. 16 is a schematic graph showing electrical characteristics of the semiconductor devices according to the first embodiment and the second embodiment of the present invention.

FIG. 8 shows semiconductor devices according to the second and third embodiments of the present invention. FIG. 16 shows an electric characteristic of the semiconductor device according to the second embodiment. FIG. 8 shows conceptual plan views of the semiconductor devices according to the second and third embodiments. FIG. 8(B) illustrates the semiconductor device according to the second embodiment, while FIG. 8(C) illustrates the semiconductor device according to the third embodiment. FIG. 16 shows a drain-to-source breakdown voltage characteristic of the semiconductor device according to the second embodiment of the present invention, wherein the abscissa axis indicates the voltage between the source and the drain, and the ordinate axis indicates the drain current (expressed as logarithm).

As shown in FIG. 8(B), the components in the semiconductor device according to the second embodiment are arranged on almost the same positions as those of the semiconductor device according to the first embodiment. However, in the semiconductor device according to the second embodiment, the second electrode provided on both sides of the first electrode 9A includes plural electrodes (electrode 9B1 and electrode 9B2, and electrode 9C1 and electrode 9C2). Specifically, the second electrode is configured to include two electrodes each on the left side and on the right side. The line widths of the plural electrodes 9B1, 9B2, 9C1, and 9C2 are smaller than the line width of the first electrode 9A. The space among the plural electrodes is filled with the sidewalls (not shown), as in the space between the first electrode and the second electrode. The space among these electrodes is set to be 0.3 micron.

Comparing the semiconductor device (FIG. 8(B)) according to the second embodiment and the semiconductor device (FIG. 6(A)) according to the first embodiment, the semiconductor device according to the second embodiment is excellent in breakdown voltage characteristic as shown in FIG. 16. Specifically, it is found from the drain-to-source breakdown voltage characteristic shown in FIG. 16 that the voltage in the voltage region by which a lot of drain current flows is higher in the semiconductor device according to the second embodiment than in the semiconductor device according to the first embodiment, regardless of the voltage between the source and the drain.

This is considered because of the reason described below. Specifically, the distance between the first gate electrode and the source/drain diffusion regions is larger in the semiconductor device according to the second embodiment than in the semiconductor device according to the first embodiment, as in the case of the semiconductor devices according to the first embodiment and the modification of the first embodiment, whereby the GIDL due to the electric field concentration caused between the source and the drain is improved, and hence, the semiconductor device according to the second embodiment is excellent in the breakdown voltage characteristic.

As shown in FIG. 8(C), the semiconductor device according to the third embodiment has the components almost the same as those of the semiconductor device according to the first embodiment. However, in the semiconductor device according to the third embodiment, the second electrode 9C is not formed on both sides of the first electrode 9A, but on one side thereof. Specifically, the gate electrode is configured to include the first electrode 9A located between two paired source/drain diffusion regions 12, and the second electrode 9C formed on both sides of the first electrode with a space, wherein the second electrode 9C is arranged on the drain region. Although not shown, a channel region is formed on a part of the semiconductor substrate below the first electrode 9A.

This configuration may be realized in the semiconductor device according to the first embodiment and the semiconductor device according to the second embodiment such that the second electrode is formed on the drain region and the second electrode is not formed on the source region. In this case, the portion where the GIDL occurs is focused, and the distance between the gate electrode and the drain region is increased. Therefore, the effect same as that of the first embodiment can be provided, and the size of the transistor can be reduced.

The third embodiment will be described below in comparison to the semiconductor device according to the first embodiment with reference to the sectional view. The semiconductor device according to the second embodiment will also be described together.

Figure 9:
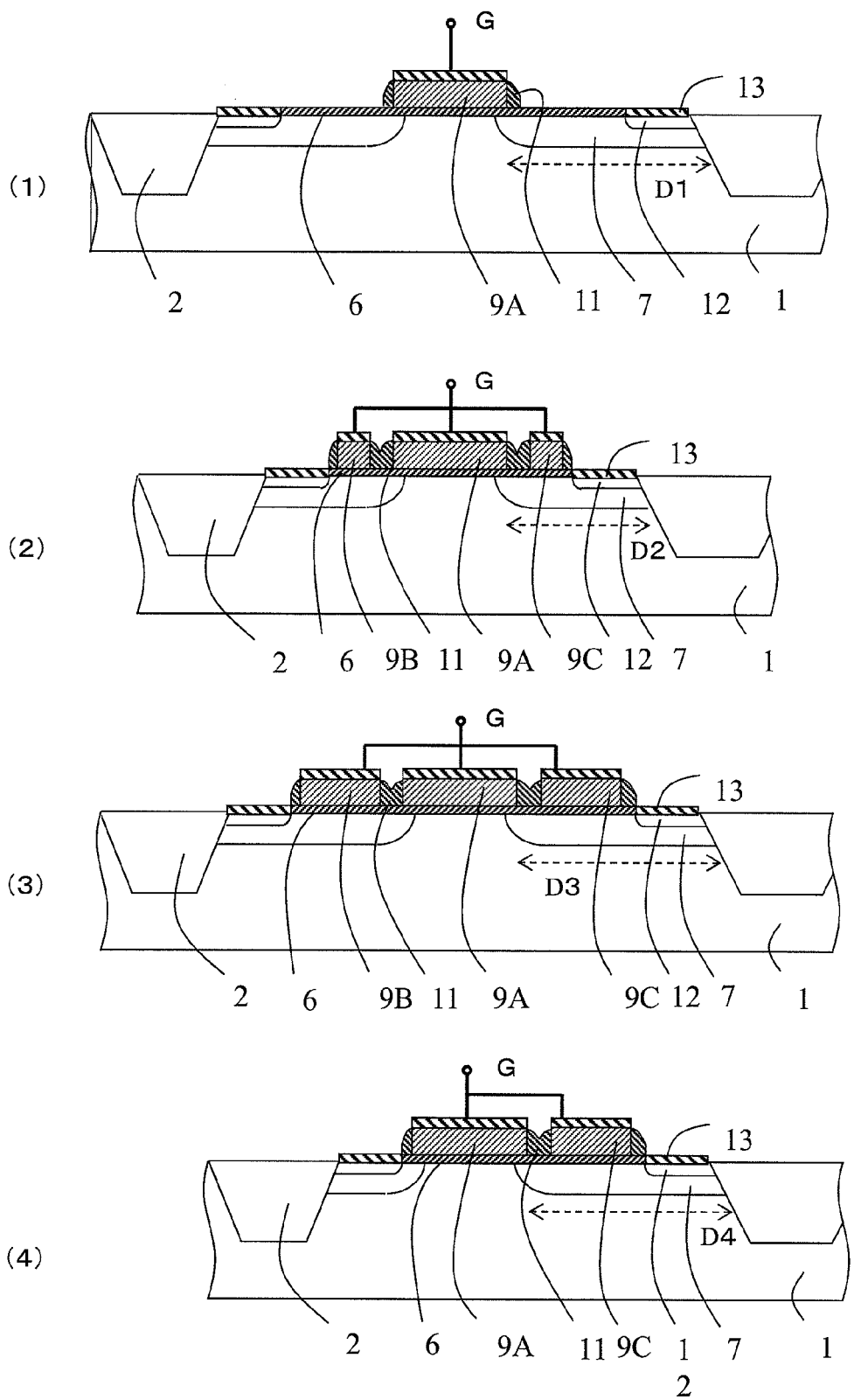
FIG. 9 is a conceptual sectional view for describing performance of the semiconductor device according to the first embodiment, the modification of the first embodiment, and the semiconductor device according to the third embodiment.
Figure 10:
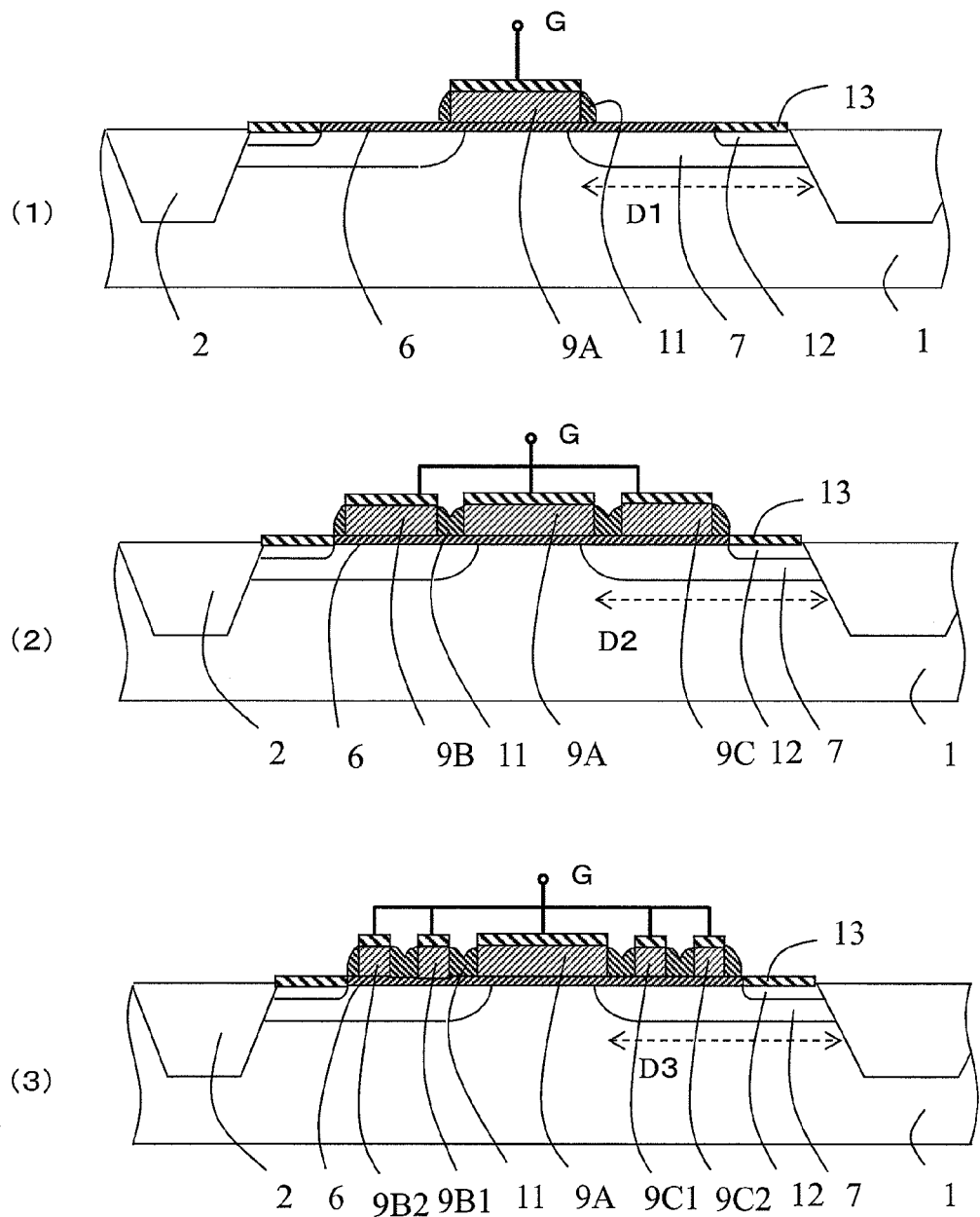
FIG. 10 is a conceptual sectional view for describing a performance of the semiconductor devices according to the first embodiment and the second embodiment.

FIG. 9 illustrates sectional views of the modification of the semiconductor device with the conventional structure (FIG. 9(1)), the semiconductor device according to the first embodiment (FIG. 9(2)), the modification according to the first embodiment (FIG. 9(3)), and the semiconductor device according to the third embodiment (FIG. 9(4)). FIG. 10 illustrates sectional views of the modification of the semiconductor device with the conventional structure (FIG. 10(1)), the semiconductor device according to the first embodiment (FIG. 10(2)), and the semiconductor device according to the second embodiment (FIG. 10(3)). FIGS. 9 and 10 are conceptual sectional views for describing the performance of these devices, and the films over the silicide layer 13 are not illustrated in these figures (the interlayer dielectric film, the contact electrode, and the metal wiring are not illustrated). A symbol "G" in the figures indicates an electrical connection (wire connection) of the gate electrode 9. It is indicated that, when a predetermined voltage is applied to the "G", this voltage is applied if there is the connection.

As shown in FIG. 9(1), the modification of the semiconductor device with the conventional structure includes the gate electrode 9A formed on the semiconductor substrate 1 through the gate insulating film 6; an insulating spacer 11 formed on the side face of the gate electrode 9A; the source region and the drain region 12 formed on the semiconductor substrate 1 so as to sandwich the gate electrode 9A; and the electric field easing region 7 formed so as to sandwich a part of the semiconductor substrate 1 below the gate electrode 9A and so as to overlap with the spacer 11 and the source region and drain region 12. The electric field easing region 7 and the source region and drain region 12 extend to the isolation region 2 to be in contact with the isolation region 2 at its boundary, and the silicide layer 13 is formed on the source region and drain region 12 and the gate electrode 9A. Although not shown, in the modification of the semiconductor device with the conventional structure, an offset forming insulating film is formed on the gate insulating film 6 between the source region and drain region 12 and the gate electrode 9A. The source region and drain region 12 are formed by using the offset forming insulating film as a mask. Therefore, a so-called drift length is the width indicated by an arrow D1 in FIG. 9(1).

On the other hand, the semiconductor device according to the first embodiment shown in FIG. 9(2) includes the gate electrode that is composed of the first gate electrode 9A, and the second gate electrodes 9B and 9C arranged on the side faces of the first gate electrode 9A through the insulating spacer 11. The source region and drain region 12 are formed on the semiconductor substrate 1 so as to sandwich the first gate electrode 9A and the second gate electrodes 9B and 9C. The electric field easing region 7 is formed so as to sandwich a part of the semiconductor substrate below the first gate electrode 9A and so as to be overlapped with the second gate electrodes 9B and 9C and the source region and drain region 12. In the semiconductor device according to the first embodiment, the source region and drain region 12 are formed by using a mask, which has a width smaller than the width of the offset forming insulating film in the modification of the semiconductor device with the conventional structure, i.e., by using the second gate electrodes 9B and 9C and the insulating spacer 11 formed on their side faces as a mask. Therefore, the drift length (an arrow D2) indicated in FIG. 9(2) is smaller than that in the modification of the semiconductor device with the conventional structure.

The semiconductor device according to the modification of the first embodiment shown in FIG. 9(3) has the same structure as that of the semiconductor device according to the first embodiment, except that the widths of the second electrodes 9B and 9C are set larger. In the modification of the first embodiment shown in FIG. 9(3), the offset forming insulating film in the modification of the semiconductor device with the conventional structure and the width of the second gate electrodes 9B and 9C and the insulating spacer 11 formed on their side faces are equal to each other. Therefore, the width of the drift length (an arrow D3) in the modification of the first embodiment shown in FIG. 9(3) is equal to the width of the drift length (the arrow D1) in the modification of the semiconductor device with the conventional structure.

The semiconductor device according to the third embodiment shown in FIG. 9(4) has the same structure as that of the semiconductor device according to the first embodiment, except that the second electrode 9C is formed on either one of the source region/drain region 12 (in FIG. 9, it is formed on the drain region). The second gate electrode 9C has the width same as the width of the second gate electrode in the modification of the first embodiment shown in FIG. 9(3). Therefore, the width of the drift length (an arrow D4) in the third embodiment shown in FIG. 9(4) is equal to the width of the second gate electrode in the modification of the first embodiment shown in FIG. 9(3).

The gate electrodes in these semiconductor devices receive an external signal input (voltage). In the semiconductor devices shown in FIGS. 9(2), 9(3), and 9(4), the first electrode and the second electrode are electrically connected.

Comparing these semiconductor devices, the semiconductor device according to the modification of the conventional semiconductor device (FIG. 9(1)), the modification of the first embodiment (FIG. 9(3)), and the semiconductor device according to the third embodiment (FIG. 9(4)) have the same breakdown voltage performance, since the breakdown voltage performance is determined by the width of the drift length.

On the other hand, the semiconductor device according to the first embodiment (FIG. 9(2)) is slightly inferior to the other semiconductor devices in the breakdown voltage performance, since the width of the drift length is short. However, the semiconductor device according to the first embodiment has more excellent in transistor capacity (I-V characteristic) than the modification (FIG. 9(3)) of the first embodiment.

Since the second gate electrode 9C is formed on either one of the source region and drain region 12 in the semiconductor device (FIG. 9(4)) according to the third embodiment, the resistance on one drift region is not applied, so that the transistor capacity (I-V characteristic) is more excellent than in the modification (FIG. 9(3)) of the first embodiment having the drift length with the same width.

Subsequently, the performance of the semiconductor device according to the second embodiment will be described in comparison to the modification of the first embodiment.

As shown in FIG. 10(3), the semiconductor device according to the second embodiment has the same structure as that of the semiconductor device (FIG. 10(2), FIG. 9(3)) according to the modification of the first embodiment, except that the second gate electrode is composed of four electrodes that are arranged on the side faces of the first gate electrode 9A through the insulating spacer 11, wherein two electrodes are arranged on each side of the first gate electrode 9A. These second gate electrodes 9B1, 9B2, 9C1, and 9C2 are electrically connected to one another, and also electrically connected to the first electrode 9A.

In the semiconductor device (FIG. 10(3)) according to the second embodiment, the width of the first and second electrodes 9A, 9B1, 9B2, 9C1, and 9C2 and the spacer 11 is equal to the width of the first and second gate electrodes 9A, 9B, and 9C and the spacer 11 in the modification of the first embodiment shown in FIG. 9(3) and FIG. 10(2). Therefore, the width of the drift length (the arrow D3) in the semiconductor device according to the second embodiment shown in FIG. 10(3) is equal to the width of the drift length (the arrow D3 in FIG. 9, and arrow D2 in FIG. 10) in the modification of the first embodiment.

Comparing these semiconductor devices, the semiconductor device (FIG. 10(3)) according to the second embodiment has the breakdown voltage characteristic same as that of the modification (FIG. 9(3) or FIG. 10(2)) according to the first embodiment, since breakdown voltage characteristic is determined by the width of the drift length.

On the other hand, in the semiconductor device (FIG. 10(3)) according to the second embodiment, the occurrence of GIDL is suppressed compared to the modification of the first embodiment, since the area of the portion where the second gate electrode and the drift region 7 are overlapped with each other is smaller than that in the modification of the first embodiment. The capacity between the gate electrode and the drain in the semiconductor device according to the second embodiment is smaller than that in the modification of the first embodiment.

FOURTH EMBODIMENT

A semiconductor device according to a fourth embodiment of the present invention will be described next.

Figure 11:
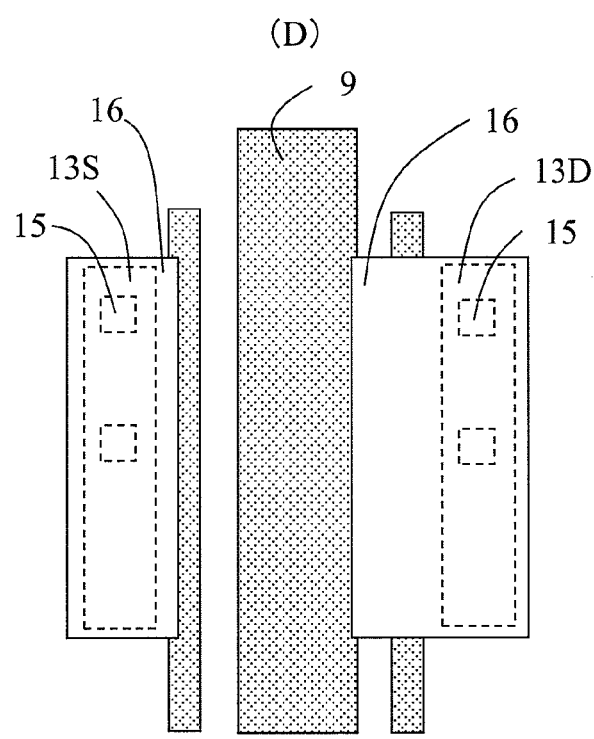
FIG. 11 is a plan view conceptually illustrating a semiconductor device according to a fourth embodiment of the present invention.
Figure 17:
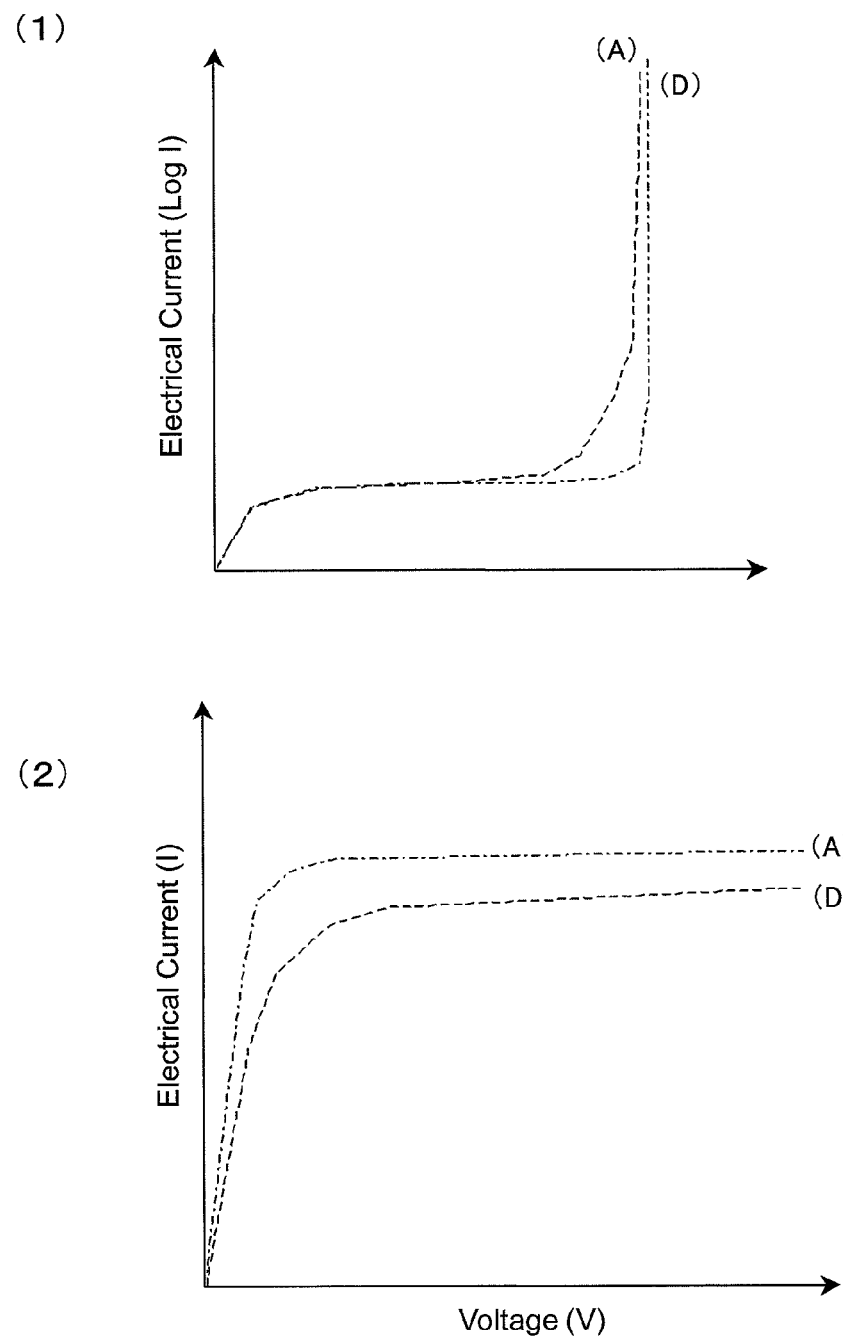
FIG. 17 is a schematic graph showing electrical characteristics of the semiconductor devices according to the first embodiment and the fourth embodiment of the present invention.

FIG. 11 shows the semiconductor device according to the fourth embodiment of the present invention. FIG. 17 shows an electric characteristic of the semiconductor device according to the fourth embodiment in comparison to the semiconductor device according to the first embodiment. FIG. 11 is a conceptual plan view of the semiconductor device according to the fourth embodiment. FIG. 17(1) shows a drain-to-source breakdown voltage characteristic of the semiconductor device according to the fourth embodiment, while FIG. 17(2) shows driving capacity of the transistor. In FIG. 17, an abscissa axis indicates a voltage between the source and the drain, while an ordinate axis indicates the drain current. In FIG. 17(1), the ordinate axis is expressed as logarithm.

As shown in FIG. 11, the components in the semiconductor device according to the fourth embodiment are arranged on almost the same positions as those of the semiconductor device according to the first embodiment, except that the first electrode 9A formed on the center and the second electrodes 9B and 9C formed on both sides of the first electrode 9A are not electrically connected (FIG. 11(D)). The second electrodes 9B and 9C are not connected to other electrodes and wirings, so that they do not accept an external electric input. Specifically, they are in a so-called floating state.

Comparing the semiconductor device (FIG. 11(D)) according to the fourth embodiment and the semiconductor device (FIG. 6(A)) according to the first embodiment, the semiconductor device according to the fourth embodiment is slightly excellent in the breakdown voltage characteristic as shown in FIG. 17. It is also found that the semiconductor device according to the first embodiment has higher driving capacity. In other words, it is found from the drain-to-source breakdown voltage characteristic in FIG. 17(1) that the voltage region (and the minimum voltage value in this region) by which a lot of drain current flows is slightly higher in the semiconductor device according to the fourth embodiment than in the semiconductor device according to the first embodiment, regardless of the voltage between the source and the drain. On the other hand, it is found from the driving capacity of the transistor in FIG. 17(2) that the drain current is larger in the semiconductor device according to the first embodiment with respect to the same voltage between the source and drain.

This is considered because the same factor as in the relationship between the semiconductor device according to the first embodiment and the modification (FIG. 7(A1)) of the first embodiment is applied for the breakdown voltage characteristic.

On the other hand, the driving capacity is considered. Since the semiconductor device according to the first embodiment applies a voltage to the second electrode, it provides an effect of reducing the electric resistance of the drift region 7. However, in the semiconductor device according to the fourth embodiment, the second electrode is in the floating state, with the result that this effect is hardly provided. Therefore, it is considered that the semiconductor device according to the fourth embodiment has relatively a low driving capacity.

As described above, the semiconductor device according to the fourth embodiment does not provide the effect of reducing the electric resistance of the drift region 7 as in the semiconductor device according to the first embodiment, since the voltage is not applied to the second electrode. However, in the semiconductor device according to the fourth embodiment, the distance between the first gate electrode and the source/drain diffusion region can be increased. Further, the effect of easing the electric field from the first gate electrode to the source/drain diffusion region via the drift region 7 is relatively strong, compared to the semiconductor device according to the first embodiment. Accordingly, the GIDL due to the electric field concentration caused between the gate and the drain is more improved.

FIFTH AND SIXTH EMBODIMENTS

Figure 12:
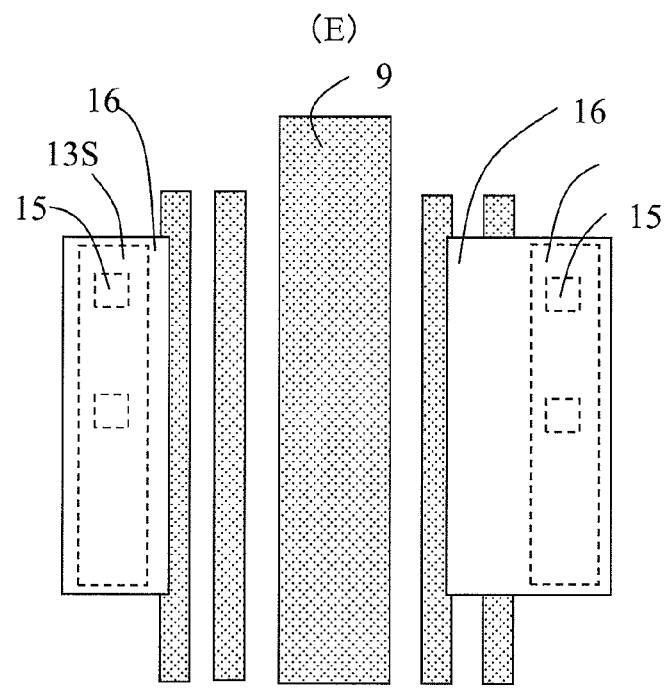
FIG. 12 is a plan view conceptually illustrating semiconductor devices according to a fifth embodiment and a sixth embodiment of the present invention.
Figure 12:
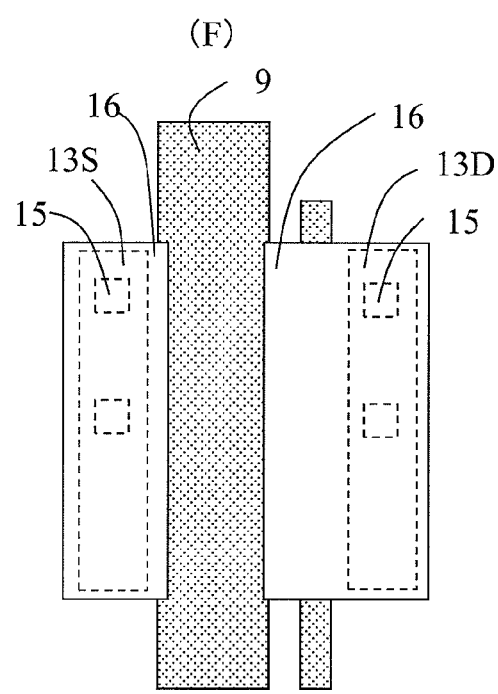
Figure 13:
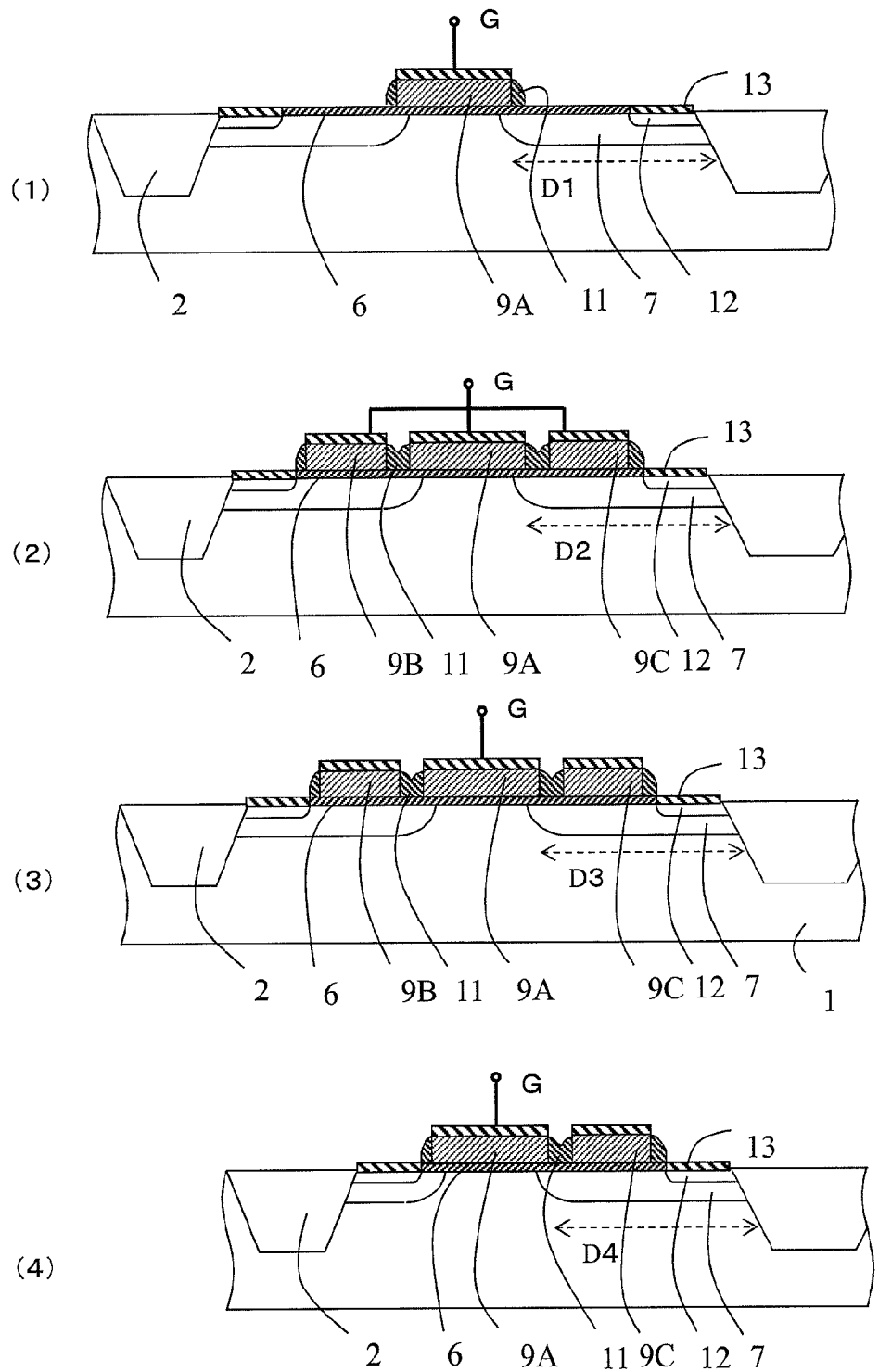
FIG. 13 is a conceptual sectional view for describing a performance of the semiconductor devices according to the first embodiment, the fourth embodiment, and the sixth embodiment.

Semiconductor devices according to fifth and sixth embodiments of the present invention will be described next.
FIG. 12 shows the semiconductor devices according to the fifth and sixth embodiments of the present invention. FIG. 12(E) shows the semiconductor device according to the fifth embodiment, while FIG. 12(F) shows the semiconductor device according to the sixth embodiment. FIG. 12 shows conceptual plan views of the semiconductor devices according to these embodiments.
As shown in FIG. 12(E), the semiconductor device according to the fifth embodiment has almost the same components as those of the semiconductor device (FIG. 8(B)) according to the second embodiment shown in FIG. 8, except that the first electrode 9A formed on the center and the second electrodes 9B1, 9B2, 9C1, and 9C2 formed on both sides of the first electrode 9A are not electrically connected (FIG. 12(E)). Further, the second electrode is composed of plural electrodes, i.e., two electrodes (the electrodes 9B1 and 9B2, and the electrodes 9C1 and 9C2) are arranged on each side of the first electrode 9A, but these electrodes 9B1, 9B2, 9C1, and 9C2 are not electrically connected to one another. Specifically, the second electrode including plural electrodes 9B1, 9B2, 9C1, and 9C2 is in a floating state.
As shown in FIG. 12(F), the semiconductor device according to the sixth embodiment has the same configuration as that of the semiconductor device (FIG. 8(C)) according to the third embodiment shown in FIG. 8, except that the second electrode 9C is in the floating state (FIG. 12(F)) as in the semiconductor device according to the fifth embodiment.
The performance of the semiconductor devices according to the fourth and sixth embodiments will be described next in comparison to the modification of the first embodiment.
FIG. 13 illustrates sectional views of the modification of the semiconductor device with the conventional structure (FIG. 13(1)), the semiconductor device according to the modification of the first embodiment (FIG. 13(2)), the modification according to the fourth embodiment (FIG. 13(3)), and the semiconductor device according to the sixth embodiment (FIG. 13(4)). FIG. 13 illustrates conceptual sectional views for describing the performance of these devices, and the films over the silicide layer 13 are not illustrated in these figures (the interlayer dielectric film, the contact electrode, and the metal wiring are not illustrated), as in FIGS. 9 and 10. A symbol "G" in the figures indicates an electrical connection (wire connection) of the gate electrode 9. It is indicated that, when a predetermined voltage is applied to the G, this voltage is applied if there is the connection.
As shown in FIG. 13(3), the semiconductor device according to the fourth embodiment has the same components as those of the semiconductor device according to the modification of the first embodiment shown in FIG. 9(3) and FIG. 13(2), except that the first electrode 9A and the second electrodes 9B and 9C are not electrically connected. The second electrodes 9B and 9C are not electrically connected to each other. Specifically, the second gate electrode 9B and the second gate electrode 9C are in the floating state.
As shown in FIG. 13(4), the semiconductor device according to the sixth embodiment has the same components as those of the semiconductor device according to the third embodiment shown in FIG. 9(4), except that the first gate electrode 9A and the second gate electrode 9C are not electrically connected to each other. Specifically, the second gate electrode 9C is in the floating state.
In the semiconductor device according to the fourth embodiment shown in FIG. 13(3), the width of the first and second electrodes 9A, 9B, and 9C and the spacer 11 is equal to the width of the first and second gate electrodes 9A, 9B, and 9C and the spacer 11 in the modification of the first embodiment shown in FIG. 9(3) and FIG. 13(2). Therefore, the width of the drift length (the arrow D3) in the semiconductor device according to the fourth embodiment shown in FIG. 13(3) is equal to the width of the drift length (the arrow D3 in FIG. 9, or arrow D2 in FIG. 13) in the modification of the first embodiment.
Similarly, in the semiconductor device according to the sixth embodiment shown in FIG. 13(4), the width of the drift length (the arrow D4) is also equal to the width of the drift length (the arrow D3 in FIG. 9, or arrow D2 in FIG. 13) in the modification of the first embodiment.
Comparing these semiconductor devices, the semiconductor device according to the fourth embodiment (FIG. 13(3)), and the semiconductor device according to the sixth embodiment (FIG. 13(4)) have the same breakdown voltage performance as that in the semiconductor device (FIG. 9(3), or FIG. 13(2)) according to the modification of the first embodiment, since the breakdown voltage performance is determined by the width of the drift length.
On the other hand, the semiconductor device according to the fourth embodiment (FIG. 13(3)) and the semiconductor device according to the sixth embodiment (FIG. 13(4)) are slightly inferior to the semiconductor device according to the modification of the first embodiment in the transistor capacity (I-V characteristic), since the second gate electrode is in the floating state. However, in the semiconductor device according to the fourth embodiment and the semiconductor device according to the sixth embodiment, the occurrence of GIDL is suppressed, so that the capacity between the gate electrode and the drain is small.

SEVENTH EMBODIMENT

Figure 18:
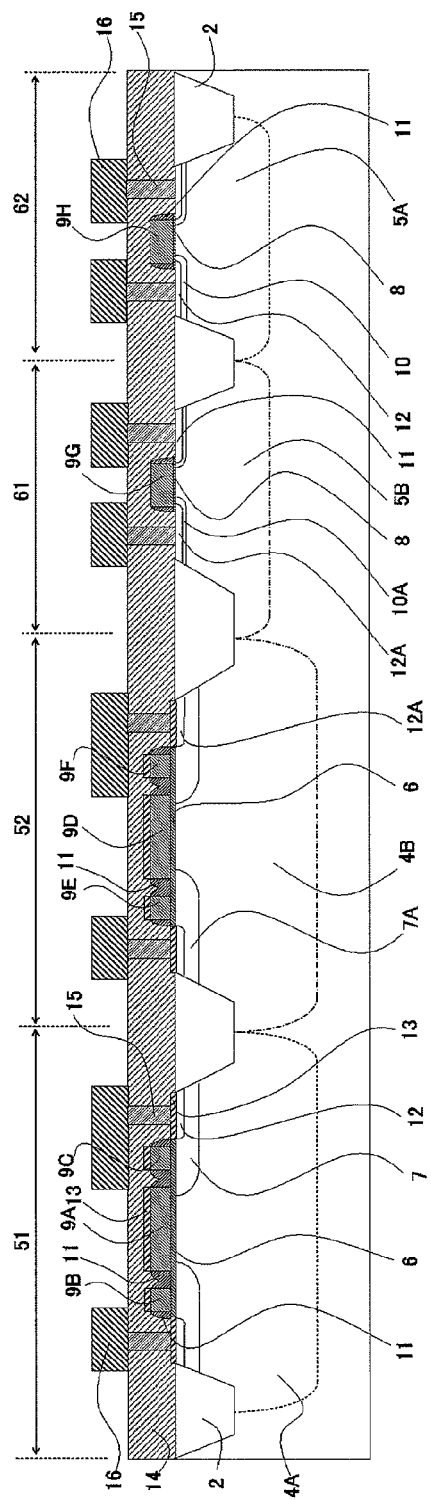
FIG. 18 is a plan view conceptually illustrating a semiconductor device according to a seventh embodiment of the present invention.
Figure 19:
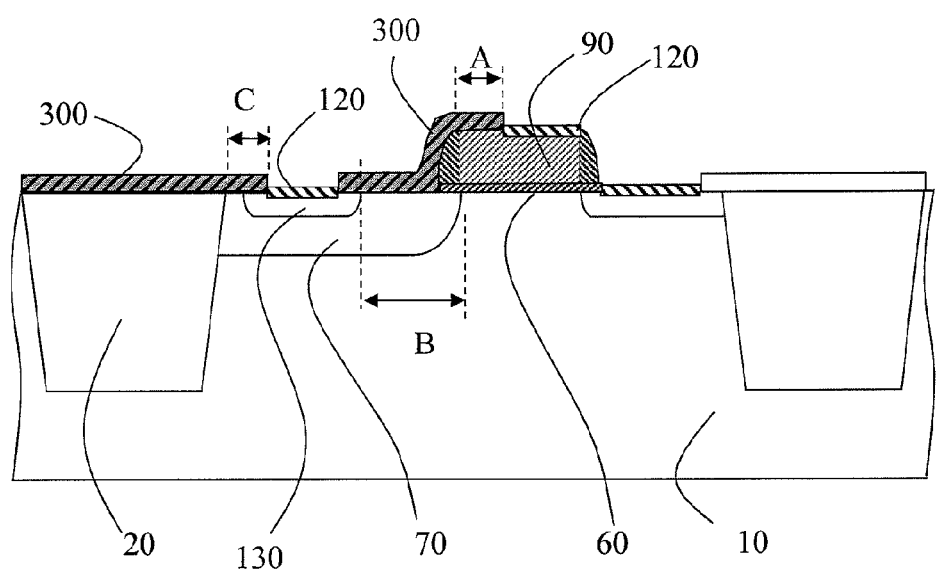
FIG. 19 is a sectional view conceptually illustrating a semiconductor device according to a background art.

A semiconductor device according to a seventh embodiment of the present invention will be described next with reference to the drawings. FIG. 18 illustrates a semiconductor substrate according to the seventh embodiment of the present invention. FIG. 18 is a conceptual sectional view of the semiconductor substrate according to the seventh embodiment.
As shown in FIG. 18, the semiconductor substrate according to the present embodiment includes plural semiconductor devices formed on plural well regions 4A, 4B, 5A, and 5B formed on the semiconductor substrate 1. Specifically, the semiconductor substrate includes a low breakdown voltage transistor formed on the well regions 5A and 5B, and a high breakdown voltage transistor formed on the well regions 4A and 4B. The low breakdown voltage transistor is formed on the well regions 5A and 5B, wherein the low breakdown voltage transistor includes gate electrodes 9G and 9H that are formed on the semiconductor substrate 1 via a gate insulating film 8 and that are provided with an insulating spacer on their side faces; source/drain diffusion regions 12 and 12A that are formed on the semiconductor substrate 1 so as to sandwich the gate electrodes 9G and 9H; and LDD regions 10 and 10A that are formed so as to sandwich a part of the semiconductor substrate below the gate electrodes 9G and 9H, and so as to be overlapped with the source/drain diffusion regions 12 and 12A. The high breakdown voltage transistor according to the first embodiment is formed on the well regions 4A and 4B.

The well regions 5A and 5B are respectively composed of a low breakdown voltage P-well region 5A and a low breakdown voltage N-well region 5B, while the well regions 4A and 4B are respectively composed of a high breakdown voltage P-well region 4A and a high breakdown voltage N-well region 4B. These well regions are formed for forming an N-channel MOS transistor and P-channel MOS transistor on the same semiconductor substrate. Each well region is isolated by the isolation region 2.

The semiconductor substrate according to the present embodiment further includes well regions for forming the high breakdown voltage transistor and the low breakdown voltage transistor on the same semiconductor substrate. Each of these well regions is isolated by the isolation region 2. These well regions can be formed with a known method by using a photoresist as a mask.

With this configuration, the high breakdown voltage semiconductor that can ease the electric field concentration and the low breakdown voltage semiconductor can be formed on the same semiconductor substrate. Therefore, the semiconductor substrate suitable for a display device can be provided. The semiconductor substrate may be a semiconductor chip.

Various features described in the above-mentioned embodiments can be combined to one another. When one embodiment includes plural features, one or plural features are appropriately extracted, and the extracted feature(s) can be employed solely or in combination for the present invention.

EXPLANATION OF NUMERALS

1 Semiconductor substrate
2 Isolation region
3 Pad oxide film
4 P-well region (well region)
4A High breakdown voltage P-well region
4B High breakdown voltage N-well region
5 N-well region (well region)
5A Low breakdown voltage P-well region
5B Low breakdown voltage N-well region
6 High breakdown voltage gate oxide film (gate insulating film)
7 N-type drift region (electric field easing region)
7A P-type drift region (electric field easing region)
8 Low breakdown voltage gate oxide film (gate insulating film)
9 Gate electrode
9A, 9B, 9C, 9D, 9E, 9F, 9G, 9H Gate electrode
10 N-type LDD (LDD region)
10A P-type LDD (LDD region)
11 Sidewall
12 N-type source/drain diffusion region (source region and drain region)
12A P-type source/drain diffusion region (source region and drain region)
13 Silicide layer
13S Source-side silicide layer
13D Drain-side silicide layer
14 Interlayer dielectric film
15 Contact electrode
16 Metal wiring
50, 51, 52 High breakdown voltage MOS transistor forming region
60, 61, 62 Low breakdown voltage MOS transistor forming region
10 Semiconductor substrate
20 Isolation region
60 Gate oxide film
60 Low-concentration diffusion layer
90 Gate electrode
120 Silicide layer
130 High-concentration diffusion layer
300 Offset forming insulating layer

The invention claimed is:

1. A semiconductor device comprising:
a first gate electrode formed above a semiconductor substrate through a gate insulating film;
a second gate electrode that is formed above the semiconductor substrate through the gate insulating film, and that is arranged at the side of the first gate electrode through an insulating spacer;
a source region and a drain region formed on the semiconductor substrate so as to sandwich the first and second gate electrodes; and
an electric-field concentration easing region that is formed to sandwich some region of the semiconductor substrate below the first gate electrode, and that is formed to be overlapped with the second gate electrode and the source and drain regions, wherein
the second gate electrode has a line width larger than a line width of the first gate electrode.

2. The semiconductor device according to claim 1, wherein the second gate electrode comprises a plurality of electrodes, and the plurality of electrodes is arranged with the insulating spacer therebetween.

3. The semiconductor device according to claim 2, wherein the insulating spacer for the plurality of electrodes has a width of 0.3 microns or less.

4. The semiconductor device according to claim 1, wherein the second gate electrode is arranged on the drain-region side of the first gate electrode, and is arranged only on the drain-region side.

5. The semiconductor device according to claim 1, wherein the semiconductor substrate and the first and second gate electrodes are made of a silicon material, and the first and second gate electrodes, the source region and the drain region each have a silicide layer formed on a surface thereof.

6. The semiconductor device according to claim 1, wherein the first gate electrode is electrically connected to a signal wiring that applies a potential to the first gate electrode, and the second gate electrode is electrically isolated from the first gate electrode and the signal wiring.

7. The semiconductor device according to claim 1, wherein the first gate electrode is electrically connected to a signal wiring that applies a potential to the first gate electrode, and the second gate electrode is electrically connected to the first gate electrode and the signal wiring.

8. A semiconductor substrate suitable for a display device, comprising:
the semiconductor device according to claim 1; and
a second semiconductor device comprising: a gate electrode that is formed above a semiconductor substrate through a gate insulating film and that is provided with an insulating spacer on its side face; a second source region and a second drain region formed on the semiconductor substrate so as to sandwich the gate electrode; and a second electric-field concentration easing region that is formed so as to sandwich some region of the semiconductor substrate below the gate electrode, and to be overlapped with the second source region and the second drain region.

\* \* \* \* \*